(12) United States Patent
Lai et al.

(10) Patent No.: US 12,268,010 B2
(45) Date of Patent: Apr. 1, 2025

(54) MEMORY DEVICE AND METHOD FOR MANUFACTURING THE SAME

(71) Applicant: MACRONIX INTERNATIONAL CO., LTD., Hsinchu (TW)

(72) Inventors: Erh-Kun Lai, Longling Shiang (TW); Hsiang-Lan Lung, Kaohsiung (TW); Chih-Hsiang Yang, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 410 days.

(21) Appl. No.: 17/698,110

(22) Filed: Mar. 18, 2022

(65) Prior Publication Data

US 2023/0301117 A1 Sep. 21, 2023

(51) Int. Cl.
  *H01L 29/06* (2006.01)
  *H10B 63/00* (2023.01)
  *H10N 70/00* (2023.01)
  *H10N 70/20* (2023.01)

(52) U.S. Cl.
  CPC ........... *H10B 63/84* (2023.02); *H10B 63/24* (2023.02); *H10N 70/063* (2023.02); *H10N 70/231* (2023.02)

(58) Field of Classification Search
  CPC ........ H10B 63/84; H10B 63/24; H10B 63/10; H10N 70/063; H10N 70/231; H10N 70/8828; H10N 70/826
  USPC ........................................................... 257/5
  See application file for complete search history.

(56) References Cited

U.S. PATENT DOCUMENTS

| | | | |
|---|---|---|---|
| 9,659,998 B1* | 5/2017 | Lung | H10N 70/021 |
| 9,721,964 B2 | 8/2017 | Lee | |
| 10,515,810 B2 | 12/2019 | Lai et al. | |
| 2019/0355790 A1* | 11/2019 | Lung | G11C 13/0004 |
| 2020/0295083 A1* | 9/2020 | Cheng | H10N 70/826 |
| 2020/0303642 A1* | 9/2020 | Sarpatwari | H10N 70/841 |
| 2022/0013485 A1 | 1/2022 | Or-Bach et al. | |

FOREIGN PATENT DOCUMENTS

| | | | |
|---|---|---|---|
| CN | 111739904 A | * | 10/2020 |
| TW | 201546966 A | | 12/2015 |
| TW | 201944537 A | | 11/2019 |

* cited by examiner

*Primary Examiner* — Tan N Tran
(74) *Attorney, Agent, or Firm* — McClure, Qualey & Rodack, LLP

(57) ABSTRACT

A memory device includes a substrate, a first conductive stripe disposed on the substrate and extending along a first direction, a second conductive stripe disposed on the first conductive stripe, a first pillar element and a spacer. The second conductive stripe extends along a second direction intersected with the first direction. A thickness of the second conductive stripe is greater than a thickness of the first conductive stripe, and the second conductive stripe is an integral structure. The first pillar element is disposed at an intersection between the first conductive stripe and the second conductive stripe, and extends from a top surface of the first conductive stripe to a bottom surface of the second conductive stripe along a third direction intersected with the first direction and the second direction. The first pillar element includes a switching layer and a memory layer corresponding to a first level.

10 Claims, 45 Drawing Sheets

MEMORY DEVICE AND METHOD FOR MANUFACTURING THE SAME

BACKGROUND OF THE INVENTION

Field of the Invention

The invention relates in general to a memory device, and more particularly to a three-dimensional memory device.

Description of the Related Art

Recently, people's demand for memory devices continues to increase. With more and more applications nowadays, memory devices with higher storage capacity must be provided to meet demands in the market. Therefore, an improved three-dimensional memory device and a method for manufacturing the same are the main trend in the current research.

SUMMARY OF THE INVENTION

The present invention relates to a memory device, and more particularly to a three-dimensional memory device. The three-dimensional memory device of the present application can provide a memory device with high storage capacity. Compared with the comparative example where the conductive stripes all have the same thickness, each of the conductive stripes corresponding to the middle level in the present application is an integral structure, and can have a larger thickness, which can make the conductive stripes have a lower resistance.

According to an embodiment of the present invention, a memory device is provided. The memory device includes a substrate, a first conductive stripe, a second conductive stripe, a first pillar element and a spacer. The first conductive stripe is disposed on the substrate and extends along a first direction. The second conductive stripe is disposed on the first conductive stripe and extends along a second direction, wherein the first direction and the second direction are parallel to an upper surface of the substrate, and the second direction and the first direction are intersected, and a thickness of the second conductive stripe is greater than a thickness of the first conductive stripe, and the second conductive stripe is an integral structure. The first pillar element is disposed at an intersection between the first conductive stripe and the second conductive stripe, and extends from a top surface of the first conductive stripe to a bottom surface of the second conductive stripe along a third direction, and the third direction is intersected with the first direction and the second direction. The first pillar element includes a switching layer and a memory layer corresponding to a first level. The spacer surrounds and directly contacts the first pillar element.

According to another embodiment of the present invention, a method for manufacturing the memory device is provided. The method includes the following steps. A substrate is provided; a first conductive stripe is formed on the substrate and extends along a first direction; a second conductive stripe is formed on the first conductive stripe and extends along a second direction, wherein the first direction and the second direction are parallel to an upper surface of the substrate, and the second direction and the first direction are intersected, and a thickness of the second conductive stripe is greater than a thickness of the first conductive stripe, and the second conductive stripe is an integral structure; and a first pillar element is formed at an intersection between the first conductive stripe and the second conductive stripe, and wherein the first pillar element extends from a top surface of the first conductive stripe to a bottom surface of the second conductive stripe along a third direction, and the third direction is intersected with the first direction and the second direction, wherein the first pillar element includes a switching layer and a memory layer corresponding to a first level.

The above and other aspects of the invention will become better understood with regard to the following detailed description of the preferred but non-limiting embodiment(s). The following description is made with reference to the accompanying drawings.

DETAILED DESCRIPTION OF THE INVENTION

In the following detailed description, for ease of explanation, various specific details are provided to understand the embodiments of the present disclosure as a whole. However, it should be understood that one or more embodiments can be implemented without employing these specific details. In other cases, in order to simplify the drawings, the known structures and components are shown in schematic diagrams.

The singular forms "one" and "the" used in the specification and the appended claims of the present application include plural expressions, unless there are clear instructions in the context. For example, the expression "a first conductive stripe" includes a plurality of such first conductive stripes.

The memory device of the present application can be applied to 3D Phase-change memory (3D PCM), or other suitable memory.

Figure 18:
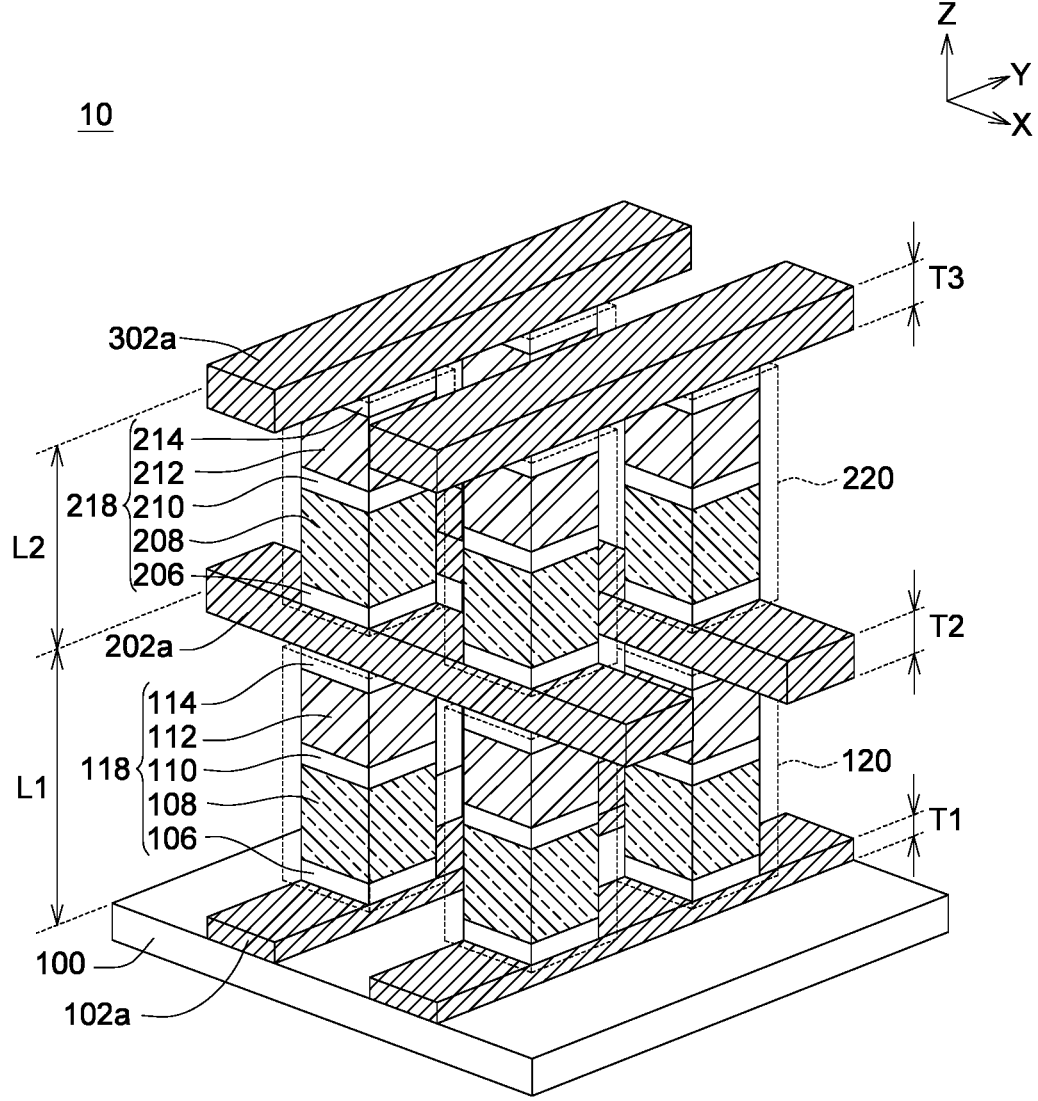
FIG. 18 shows a partial perspective view of a memory device according to an embodiment of the present invention.

FIGS. 1A-17E show a flowchart of a method for manufacturing a memory device 10 according to an embodiment of the present invention. FIG. 18 shows a partial perspective view of a memory device 10 according to an embodiment of the present invention. Further, top views shown in FIGS. 1A, 2A, 3A, 4A, 5A, 6A, 7A, 8A, 9A, 10A, 11A, 12A, 13A, 14A, 15A, 16A, and 17A can correspond to a plane formed by a second direction (for example, X direction) and the first direction (for example, the Y direction). FIGS. 1B, 2B, 3B, 4B, 5B, 6B, 7B, 8B, 9B, 10B, 11B, 12B, 13B, 14B, 15B, 16B and 17B shows cross-sectional views taken along the lines A-A of FIGS. 1A, 2A, 3A, 4A, 5A, 6A, 7A, 8A, 9A, 10A, 11A, 12A, 13A, 14A, 15A, 16A, and 17A, respectively, and can respectively correspond to a plane formed by the second direction (for example, X direction) and the third direction (for example, Z direction). FIGS. 10C, 11C, 12C, 13C, 14C, 15C, 16C and 17C respectively show cross-sectional views taken along the lines B-B of FIGS. 10A, 11A, 12A, 13A, 14A, 15A, 16A, and 17A, and can respectively correspond to a plane formed by the second direction (for example, X direction) and the third direction (for example, Z direction). FIGS. 10D, 11D, 12D, 13D, 14D,

15D, 16D, and 17D respectively show the cross-sectional views taken along the lines C-C of FIGS. 10A, 11A, 12A, 13A, 14A, 15A, 16A, and 17A, and can respectively correspond to the plane formed by the first direction (such as Y direction) and the third direction (such as Z direction). FIGS. 10E, 11E, 12E, 13E, 14E, 15E, 16E, and 17E respectively show cross-sectional views taken along the lines D-D of FIGS. 10A, 11A, 12A, 13A, 14A, 15A, 16A, and 17A, and can respectively correspond to the plane formed by the first direction (for example, Y direction) and the third direction (for example, Z direction). The second direction, the first direction, and the third direction may be intersected with each other, for example, may be perpendicular to each other, and it should be understood that the present invention is not limited thereto.

Figure 1A:
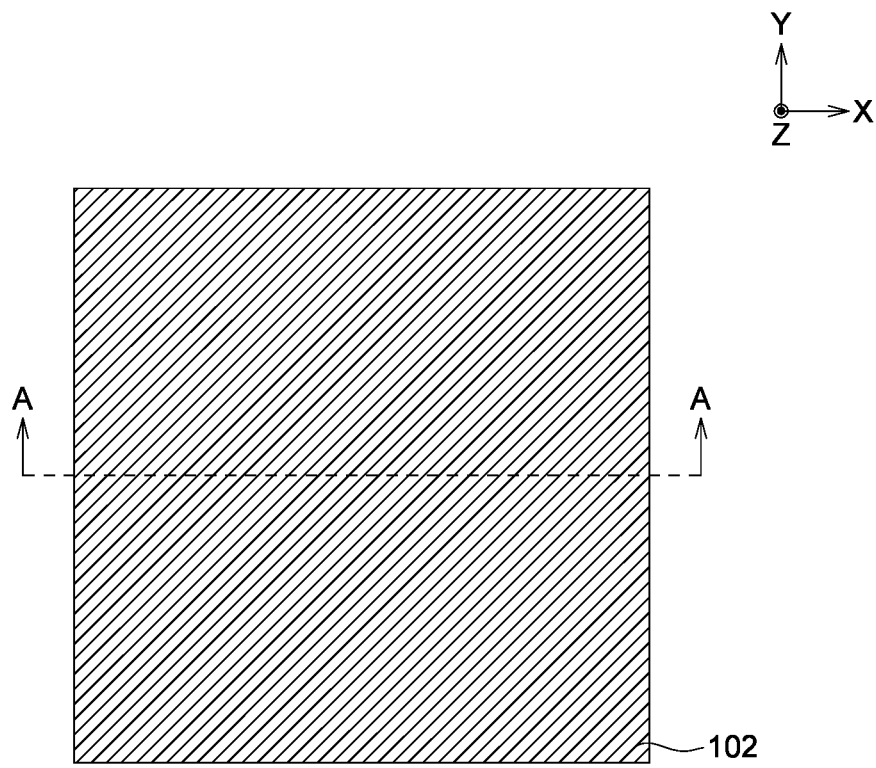
FIGS. 1A-17E show a flowchart of a method for manufacturing a memory device according to an embodiment of the present invention.
Figure 1B:
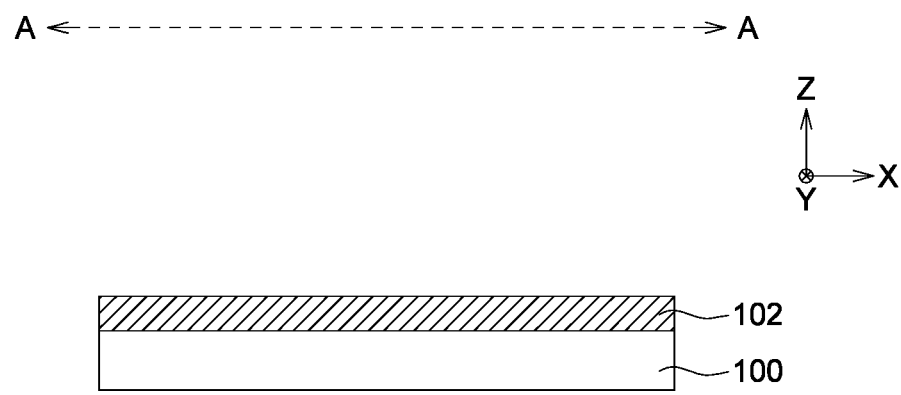

First, referring to FIGS. 1A and 1B at the same time, a substrate 100 is provided, and a first conductive layer 102 is formed on the substrate. In some embodiments, the first conductive layer 102 may be formed on an upper surface of the substrate 100 by a deposition process. The material of the substrate 100 may be a dielectric material, such as nitride or oxide, wherein the nitride is, for example, silicon nitride (SiN). In the present embodiment, the first conductive layer 102 is formed by physical vapor deposition (PVD), and the material of the first conductive layer 102 is tungsten, but the present invention is not limited thereto. In some embodiments, a through hole (not shown) for electrically connecting to a device may be provided under the first conductive layer 102.

Figure 2A:
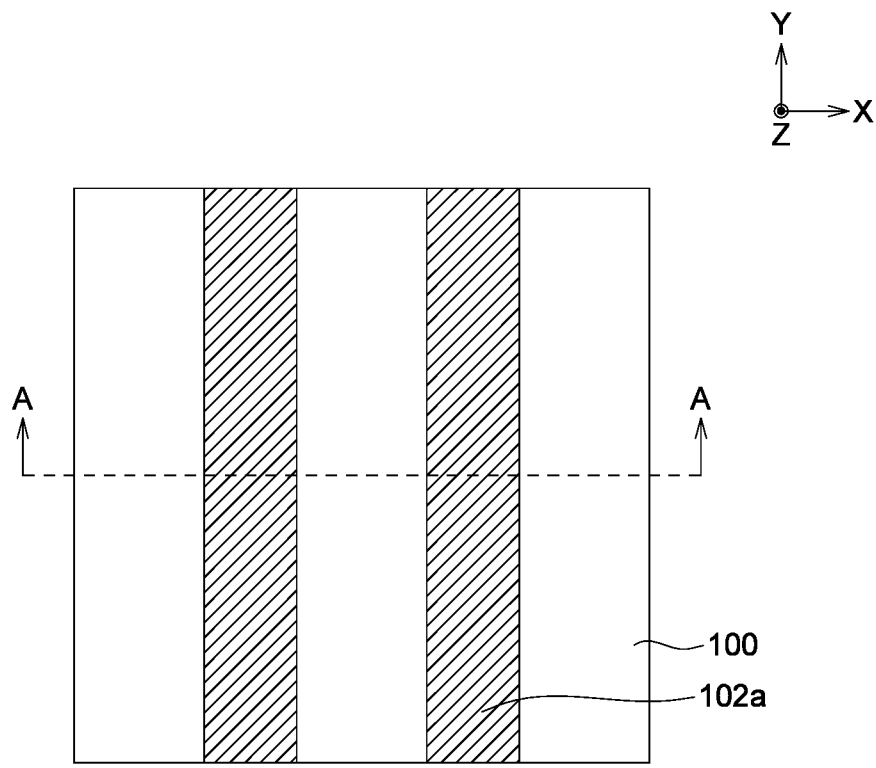
Figure 2B:
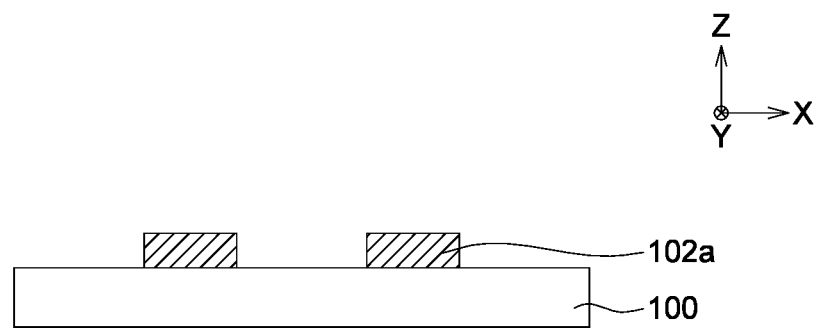

Referring to FIGS. 2A and 2B at the same time, the first conductive layer 102 is patterned to form a plurality of first conductive stripes 102a. In detail, a portion of the first conductive layer 102 is removed to expose a portion of the upper surface of the substrate 100, and the first conductive stripes 102a respectively extending along the first direction on the upper surface of the substrate 100 and separated from each other in the second direction are formed.

Figure 3A:
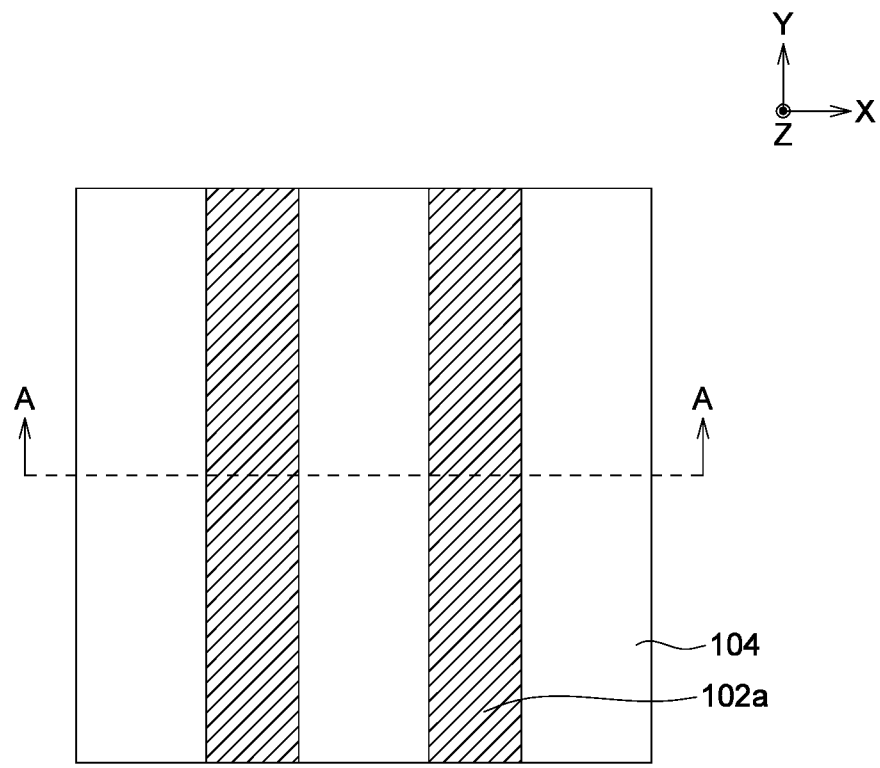
Figure 3B:
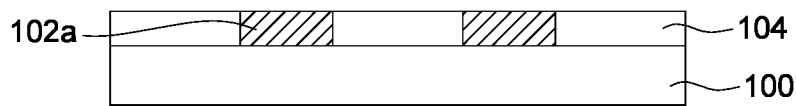

Referring to FIGS. 3A and 3B at the same time. After the insulating material 104 is deposited on the substrate 100, a top surface of the insulating material 104 and a top surface of the first conductive stripes 102a are planarized by a chemical mechanical polishing process (CMP process). The insulating material 104 may include an oxide material. In other embodiments, the insulating material 104 may be deposited on the substrate 100 first, and then the insulating material 104 may be etched to form a plurality of trenches exposing the upper surface of the substrate 100, and then the material of the first conductive layer 102 is filled in the trenches. Thereafter, the first conductive stripes 102a as shown in FIGS. 3A and 3B are formed.

Figure 4A:
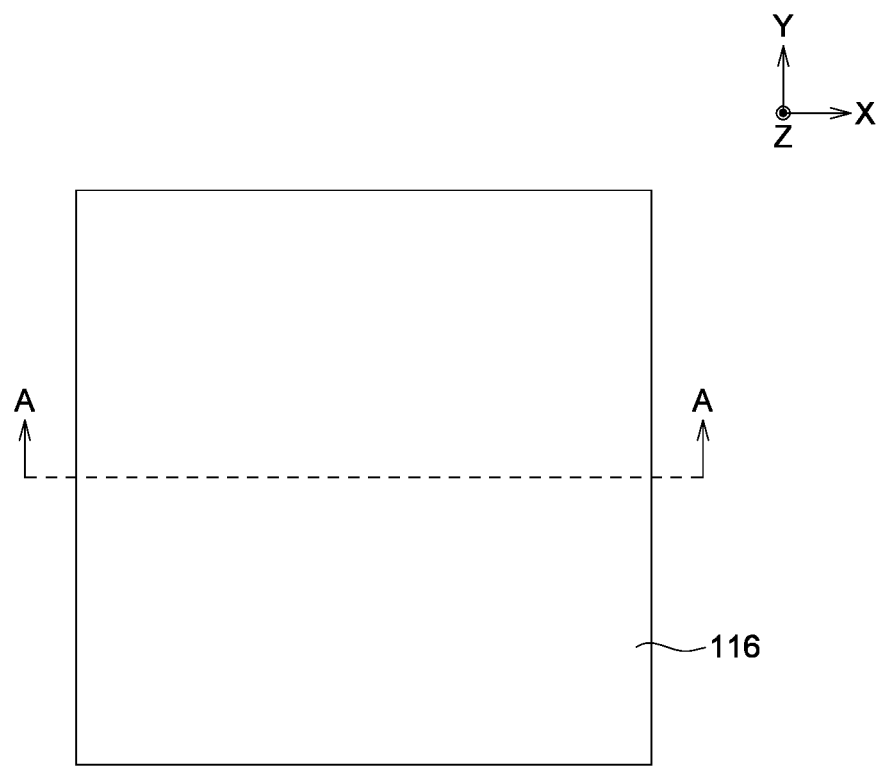
Figure 4B:
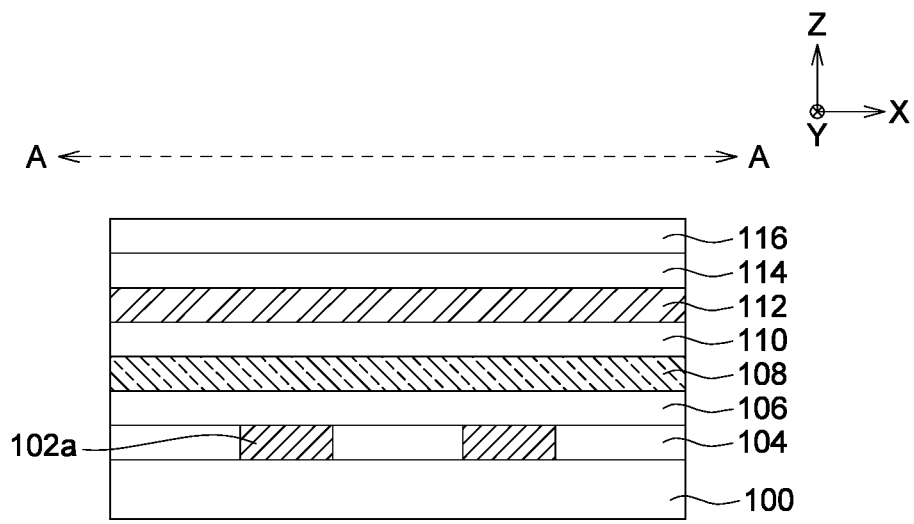

Referring to FIGS. 4A and 4B at the same time, a first buffer layer 106, a switching layer 108, a second buffer layer 110, a memory layer 112, a third buffer layer 114, and a mask layer 116 are sequentially formed on the insulating material 104 and the first conductive stripes 102a.

Figure 5A:
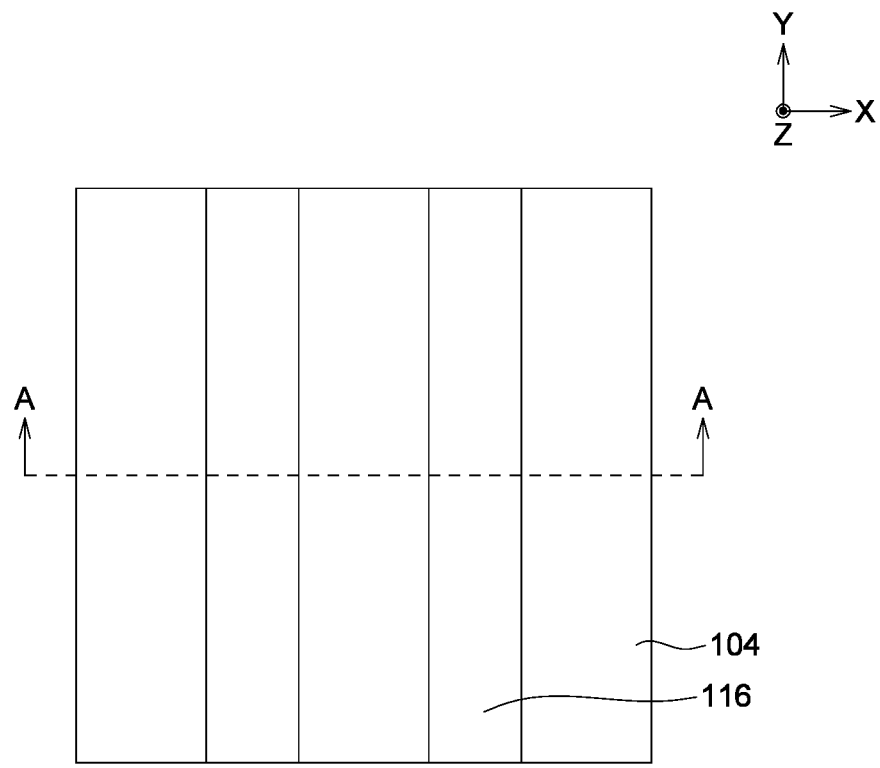
Figure 5B:
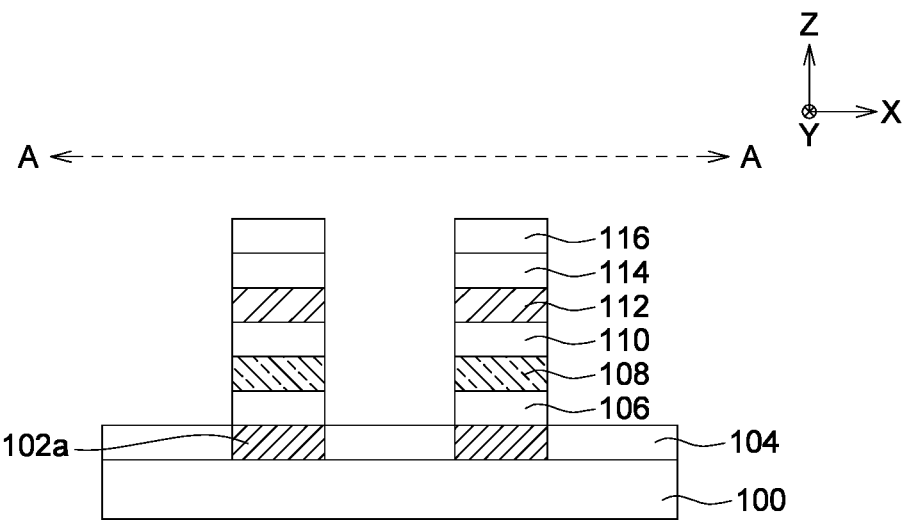

Referring to FIGS. 5A and 5B at the same time, the first buffer layer 106, the switching layer 108, the second buffer layer 110, the memory layer 112, the third buffer layer 114, and the mask layer 116 in the first level L1 are patterned. For example, a portion of the first buffer layer 106, a portion of the switching layer 108, a portion of the second buffer layer 110, a portion of the memory layer 112, a portion of the third buffer layer 114, and a portion of the mask layer 116 are removed by an etching process (that is, removing the first buffer layer 106, the switching layer 108, the second buffer layer 110, the memory layer 112, the third buffer layer 114, and the mask layer 116 which are not overlapped with the first conductive stripes 102a in the third direction) to expose a portion of the upper surface of the insulating material 104, so that the patterned (i.e. remaining) first buffer layers 106, switching layers 108, second buffer layers 110, memory layers 112, third buffer layers 114, and mask layers 116 have the same or similar profiles to the profiles of the first conductive stripes 102a, and overlap the first conductive stripes 102a in the third direction. The etching process is, for example, reactive ion etching (RIE). Since the etching steps of patterning the switching layer 108 and the memory layer 112 are performed after the etching step for forming the first conductive stripes 102a, the switching layer 108 and the memory layer 112 will not be damaged by the etchant used to etch the first conductive stripes 102a.

Figure 6A:
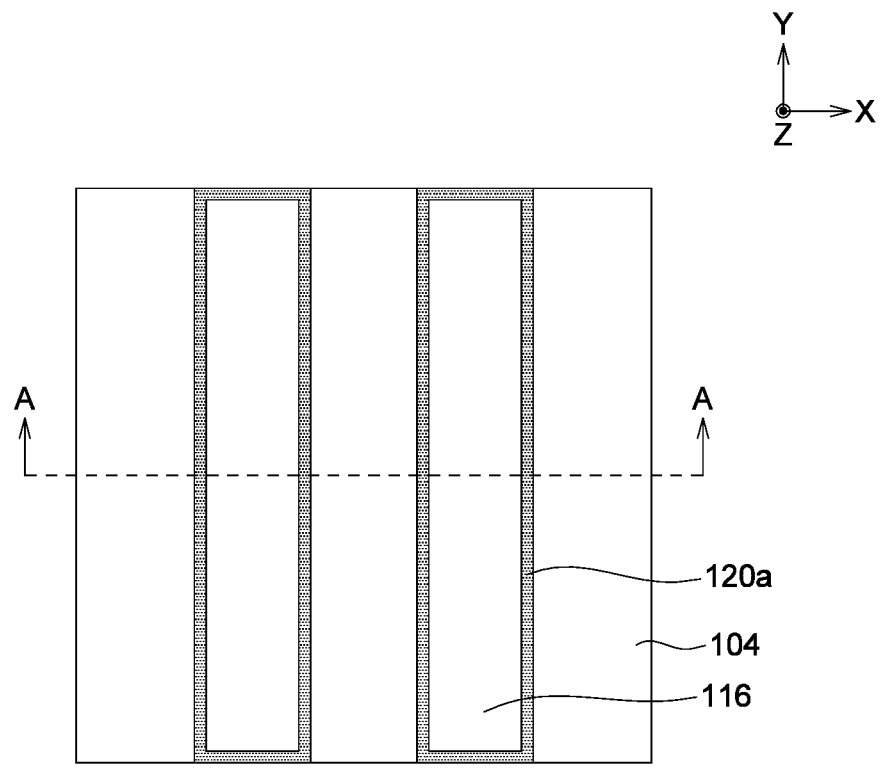
Figure 6B:
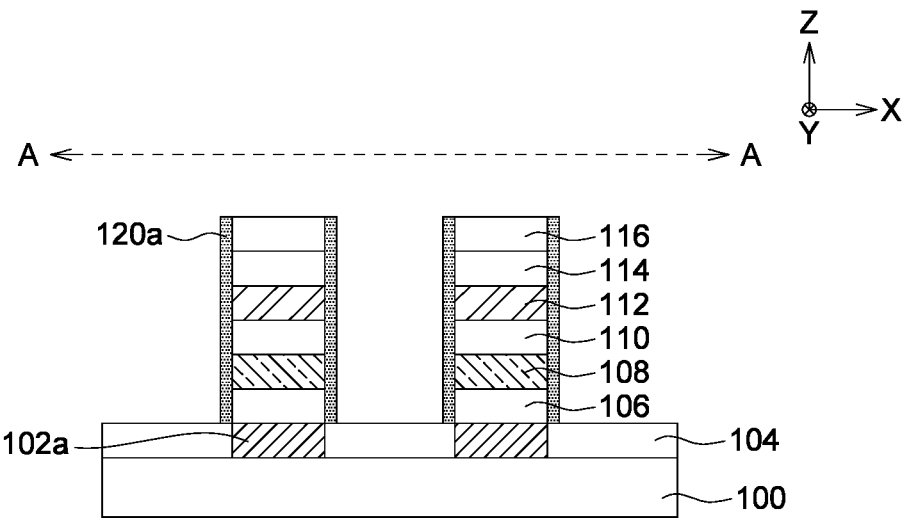

Referring to FIGS. 6A and 6B at the same time, first spacers 120a surrounding the patterned first buffer layers 106, switching layers 108, second buffer layers 110, memory layers 112, third buffer layers 114 and mask layers 116 are formed. In detail, the dielectric material is first conformally deposited on the surfaces of the insulating material 104 and the first buffer layers 106, the switching layers 108, the second buffer layers 110, the memory layers 112, the third buffer layers 114 and the mask layers 116 as shown in FIGS. 5A and 5B by a deposition process, and then a portion of the dielectric material is removed by an etching process, and the first spacers 120a are formed on sidewalls of the first buffer layers 106, the switching layers 108, the second buffer layers 110, the memory layers 112, the third buffer layers 114, and the mask layers 116 by the remaining dielectric material. Each of the first spacers 120a directly contacts the first buffer layer 106, the switching layer 108, the second buffer layer 110, the memory layer 112, and the third buffer layer 114. In an embodiment, the dielectric material (that is, the material of the first spacer 120a) may be a nitride, such as silicon nitride (SiN) or oxide. It should be noted that the first spacer 120a is not used to protect the switching layer 108 and the memory layer 112 from being damaged by the etchant used to form the first conductive stripes 102a in an etching step (such as the etching step shown in FIGS. 2A-2B), but to allow the memory device 10 to have better electrical properties, for example, enable the memory layer 112 to have better endurance and retention or better device performance. Since the present invention does not require the first spacer 120a to protect the switching layer 108 and the memory layer 112 from being damaged by the etchant used to form the first conductive stripe 102a in the etching step, in other embodiments, the first spacers 120a may also be omitted.

Figure 7A:
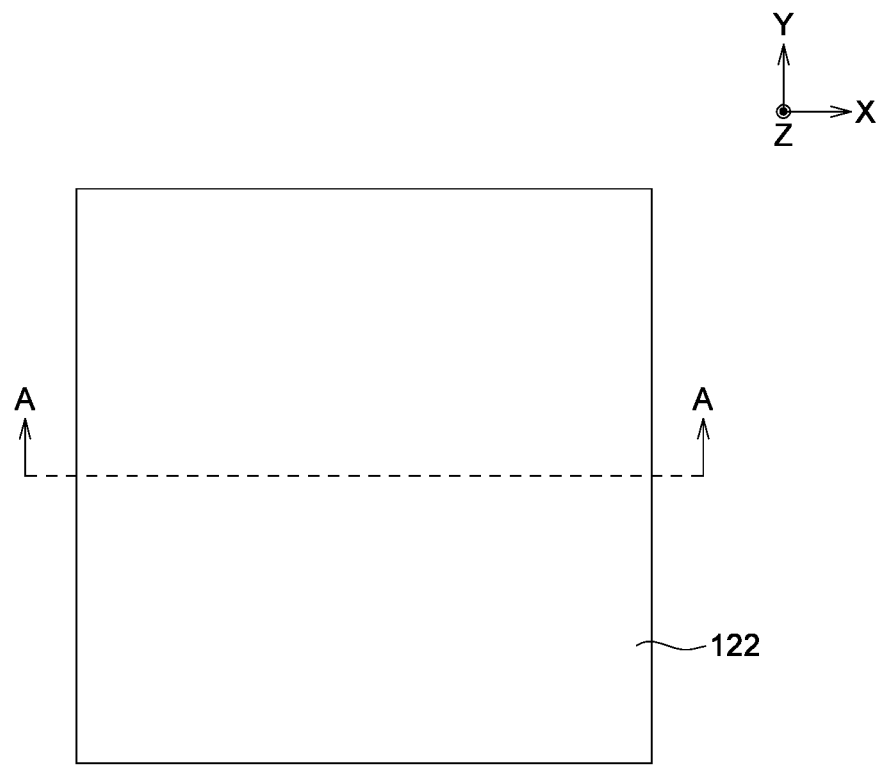
Figure 7B:
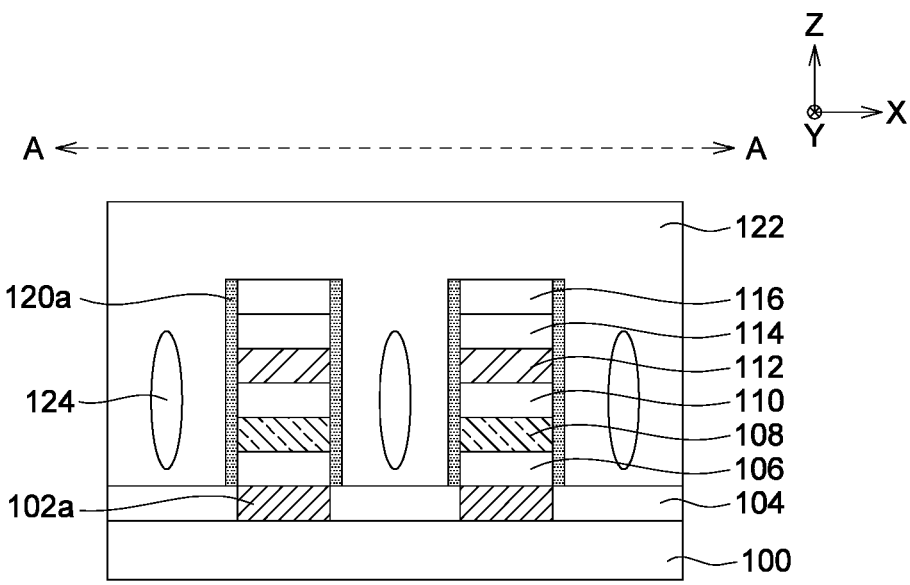

Referring to FIGS. 7A and 7B at the same time, an insulating material 122 is formed between the first spacers 120a and on the mask layers 116 by a deposition process, and the insulating material 122 can form air gaps 124 between the first spacers 120a. The air gaps 124 can improve thermal efficiency. The insulating material 122 is, for example, an oxide with a low dielectric constant.

Figure 8A:
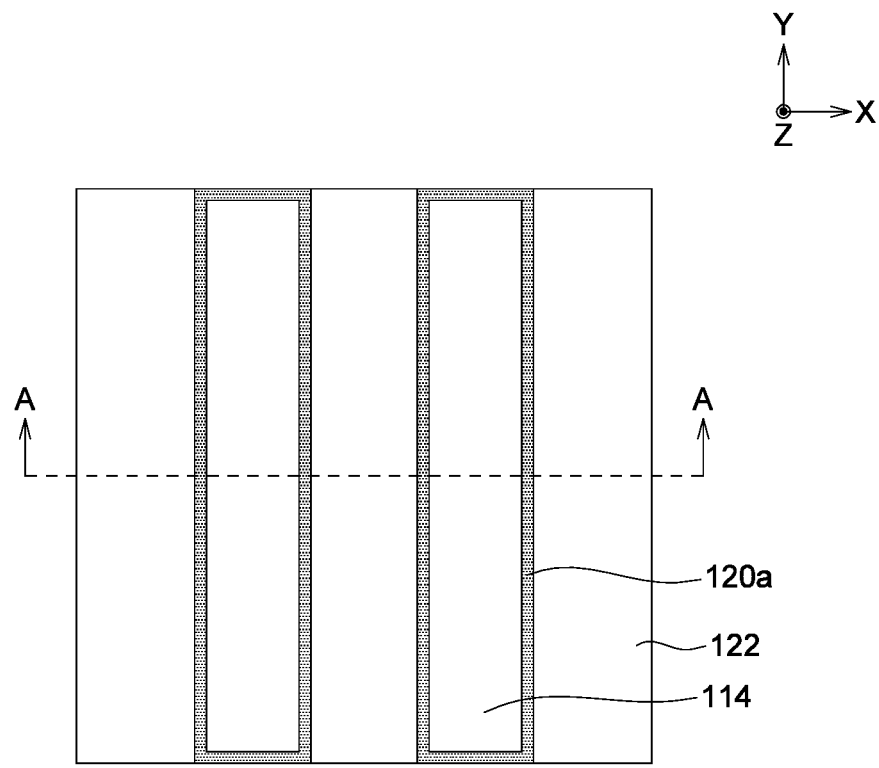
Figure 8B:
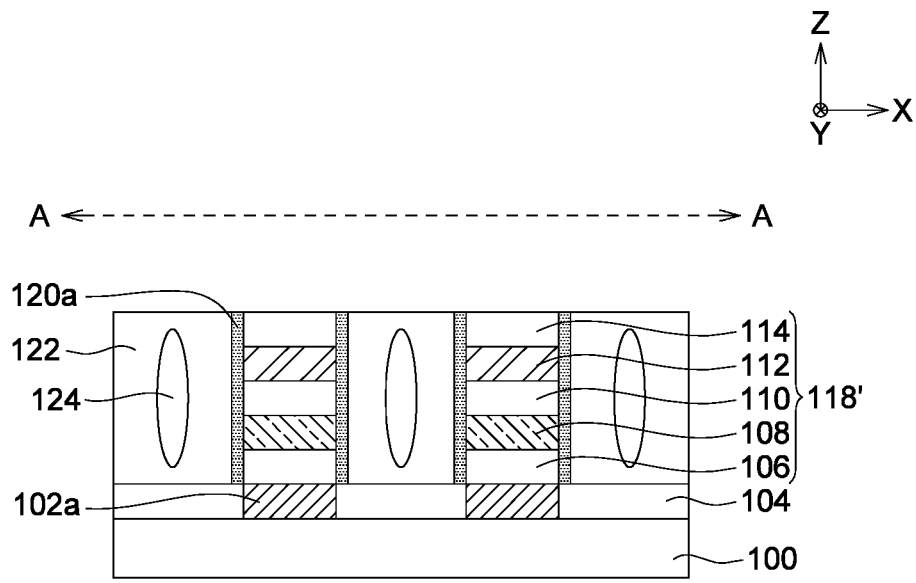

Referring to FIGS. 8A and 8B at the same time, a portion of the insulating material 122 and a portion of the first spacers 120a are removed by a chemical mechanical polishing process, and the mask layers 116 are completely removed to expose top surfaces of the third buffer layer 114. In this way, first film stacks 118' which respectively correspond to the shape of the first conductive stripes 102a and overlap the first conductive stripes 102a in the third direction are formed. The first spacers 120a surround the first film stacks 118'.

Figure 9A:
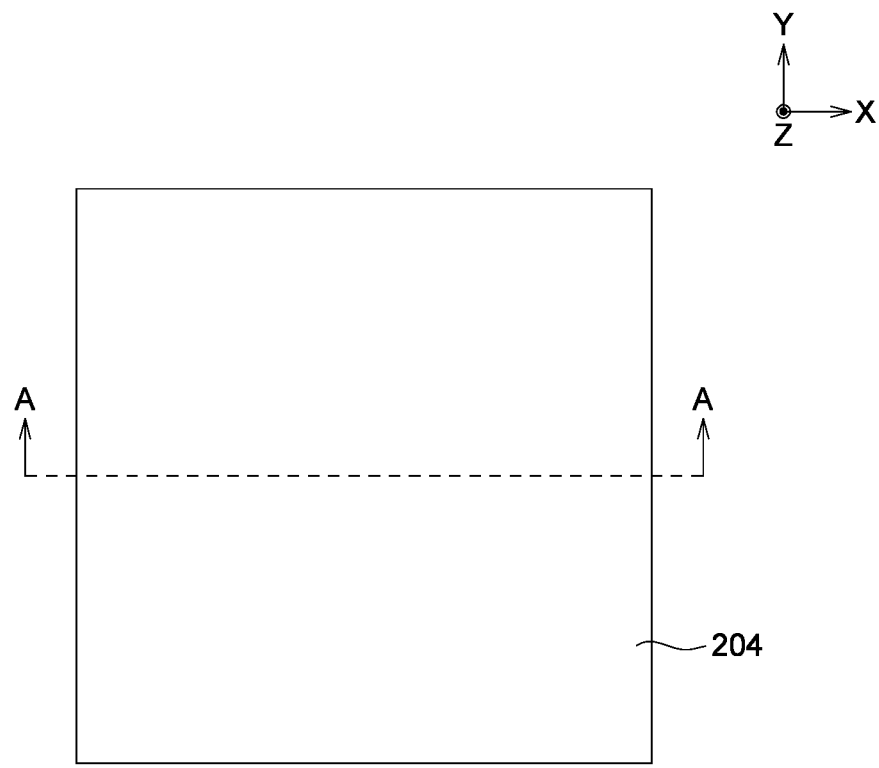
Figure 9B:
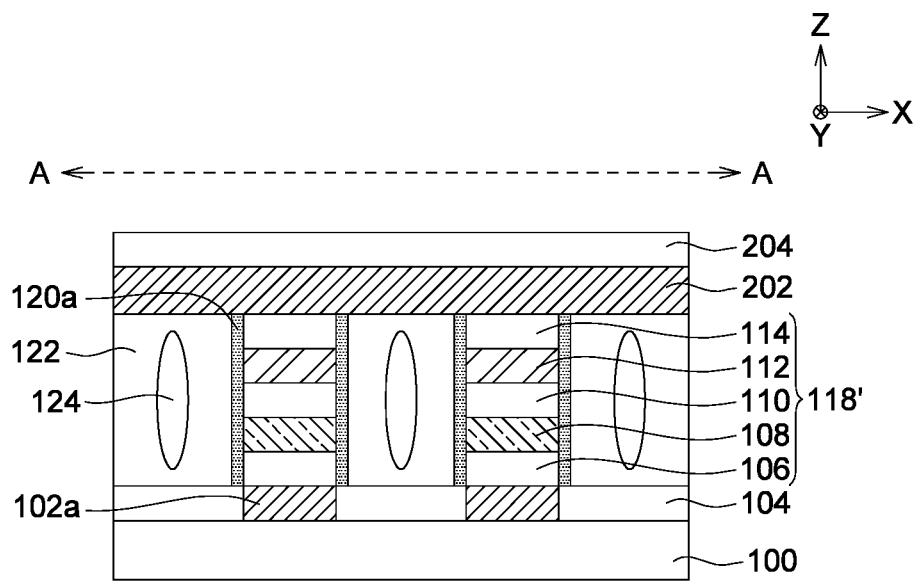
Figure 10A:
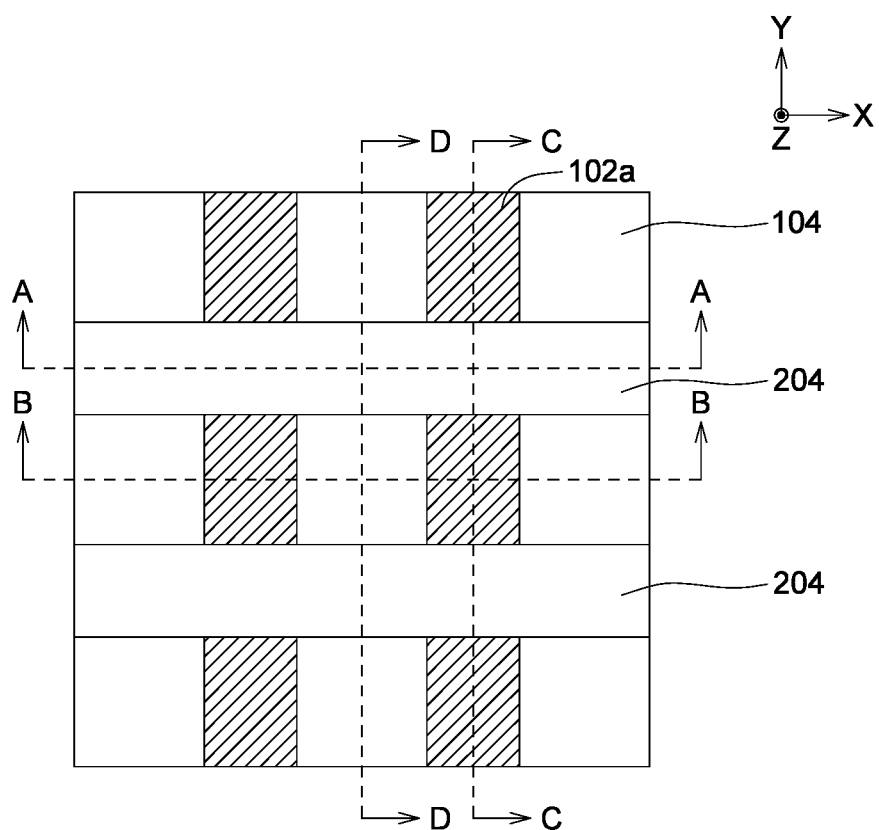
Figure 10B:
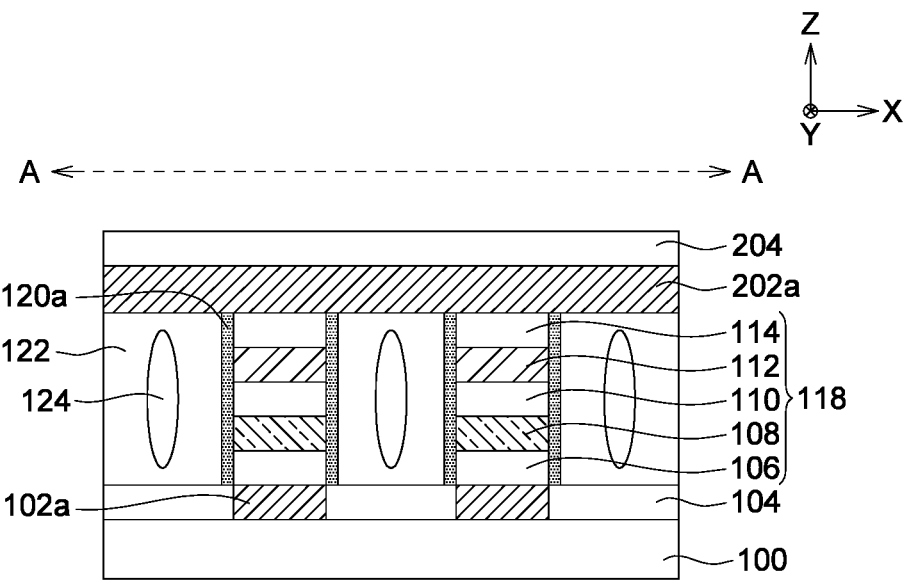
Figure 10C:
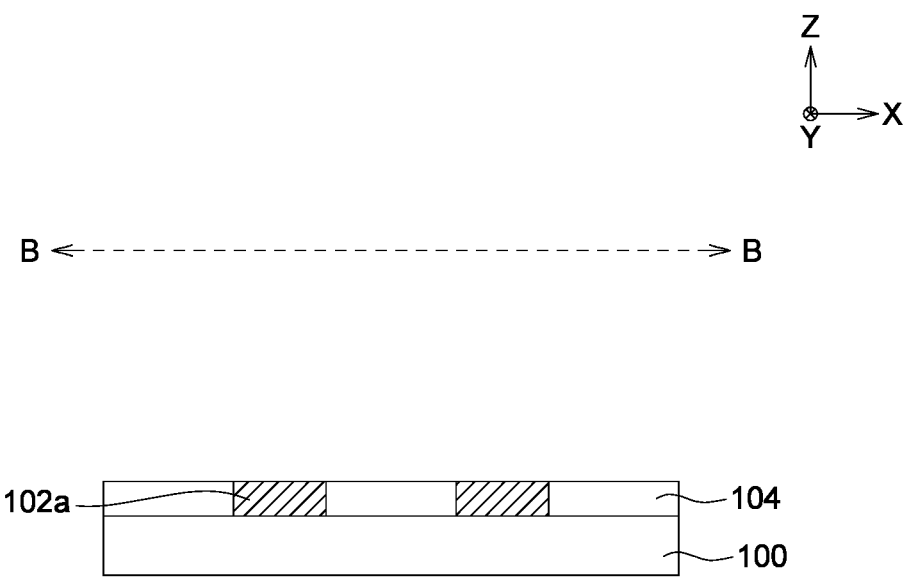
Figure 10D:
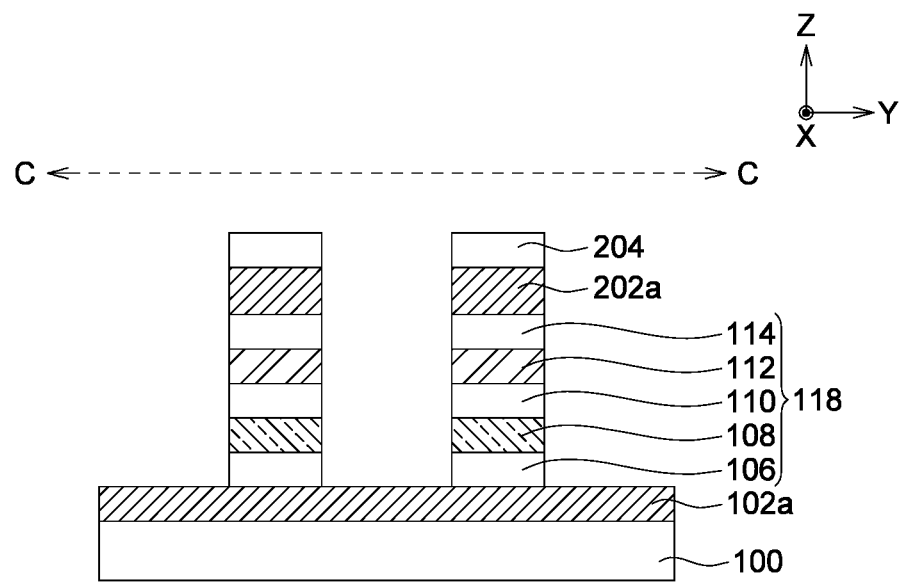
Figure 10E:
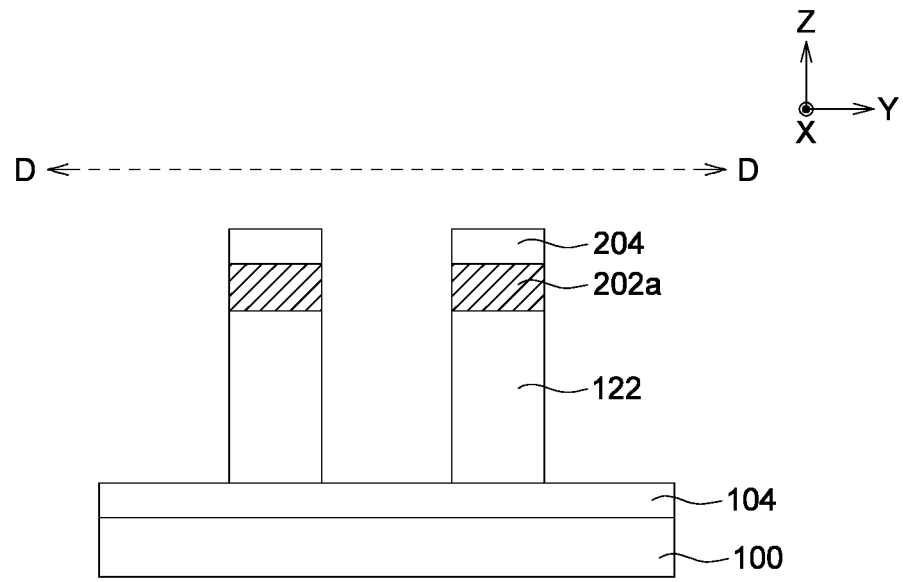

Referring to FIGS. 9A and 9B at the same time, a second conductive layer 202 and a mask layer 204 are sequentially formed on the first film stacks 118', the first spacers 120a and the insulating material 122 by the deposition process.

Referring to FIGS. 10A to 10E at the same time, a portion of the second conductive layer 202 and a portion of the mask layer 204 are removed by a first etching process, that is, the second conductive layer 202 is patterned to form a plurality of second conductive stripes 202a extending in the second direction and separated from each other in the first direction, respectively, and after patterning the second conductive layer 202 (that is, the first etching process), a portion of the film stacks 118', a portion of the first spacer 120a and a portion of the insulating material 122 are removed by a second etching process, to expose a portion of the first conductive stripes 102a and a portion of the insulating material 104 (that is, exposing the first conductive stripes 102a and the insulating material 104 that do not overlap the second conductive stripes 202a in the third direction). After the steps of the first etching process and the second etching process, the first film stacks 118' disposed at the intersections between the first conductive stripes 102a and the second conductive stripes 202a are remained to form first pillar elements 118 corresponding to the first level L1 of the memory device 10. The etching process is, for example, reactive ion etching. The extension direction of the first conductive stripes 102a is, for example, perpendicular to the extension direction of the second conductive stripes 202a. Since the second etching process is performed after the first etching process, and the second etching process is stopped above the first conductive stripes 102a, the conductive stripes (such as the first conductive stripes 102a and the second conductive stripes 202a) are not required to be etched during or after the etching step for the switching layer 108 and the memory layer 112, so the etchant used for patterning the conductive stripes will not damage the switching layer 108 and the memory layer 112.

Figure 11A:
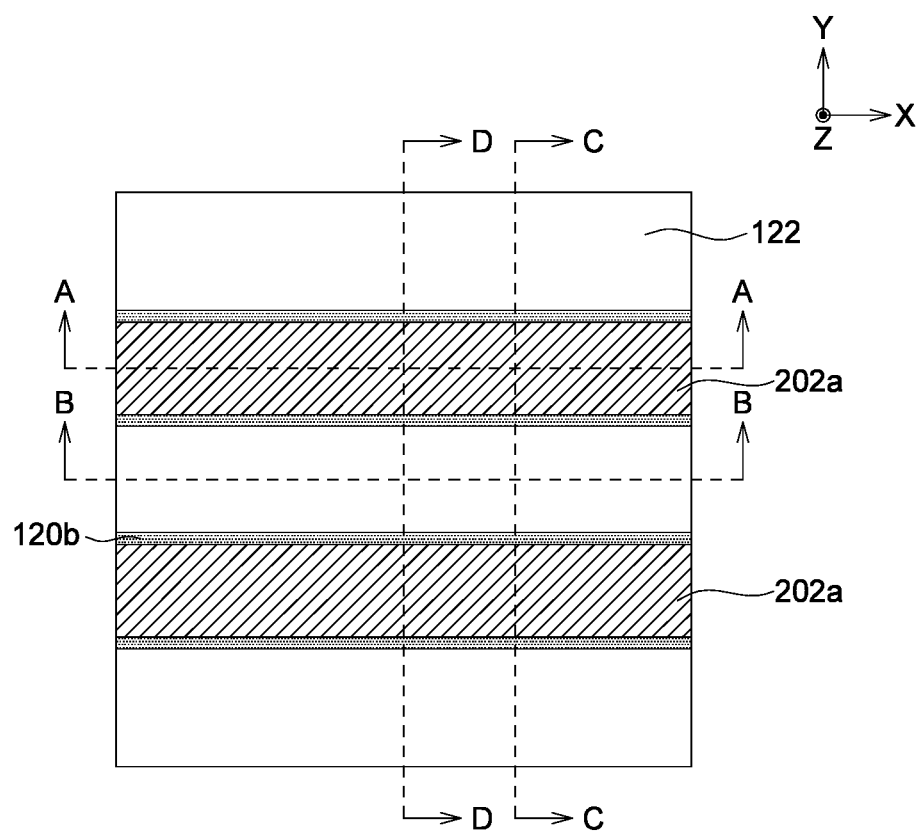
Figure 11B:
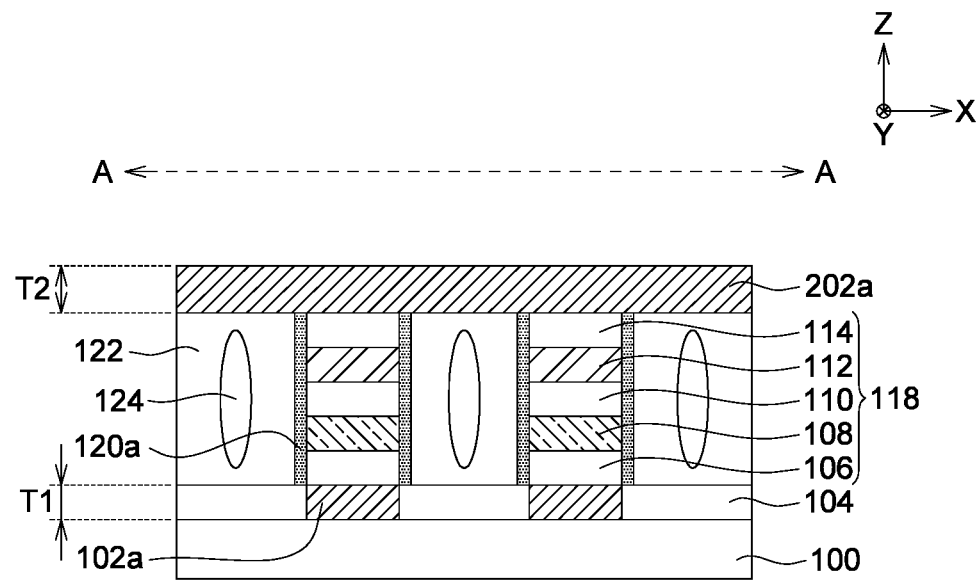
Figure 11C:
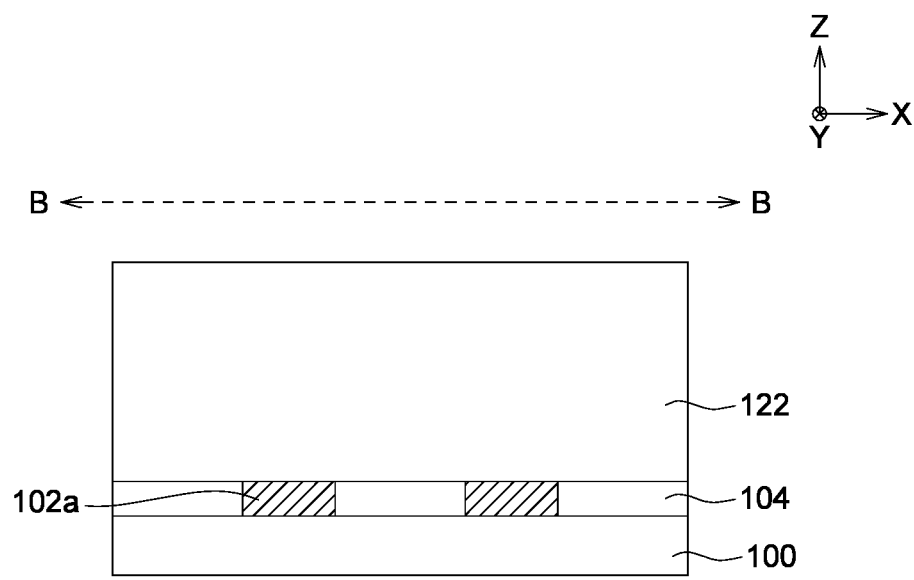
Figure 11D:
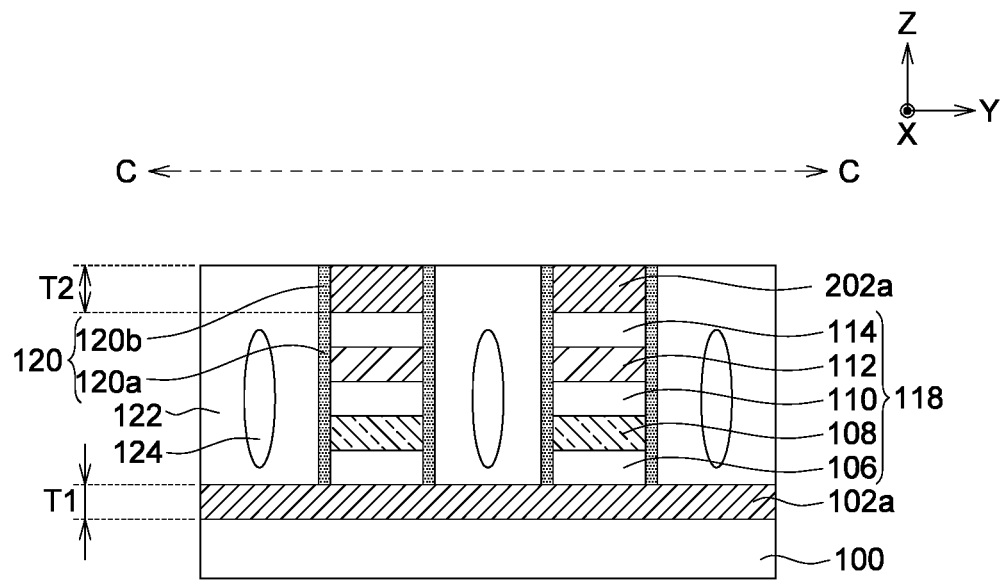
Figure 11E:
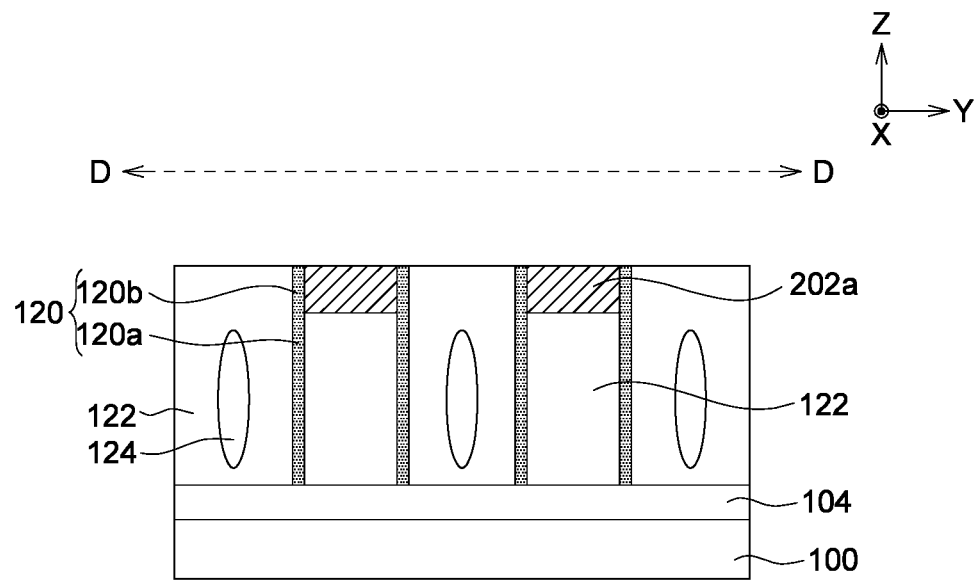
Figure 12A:
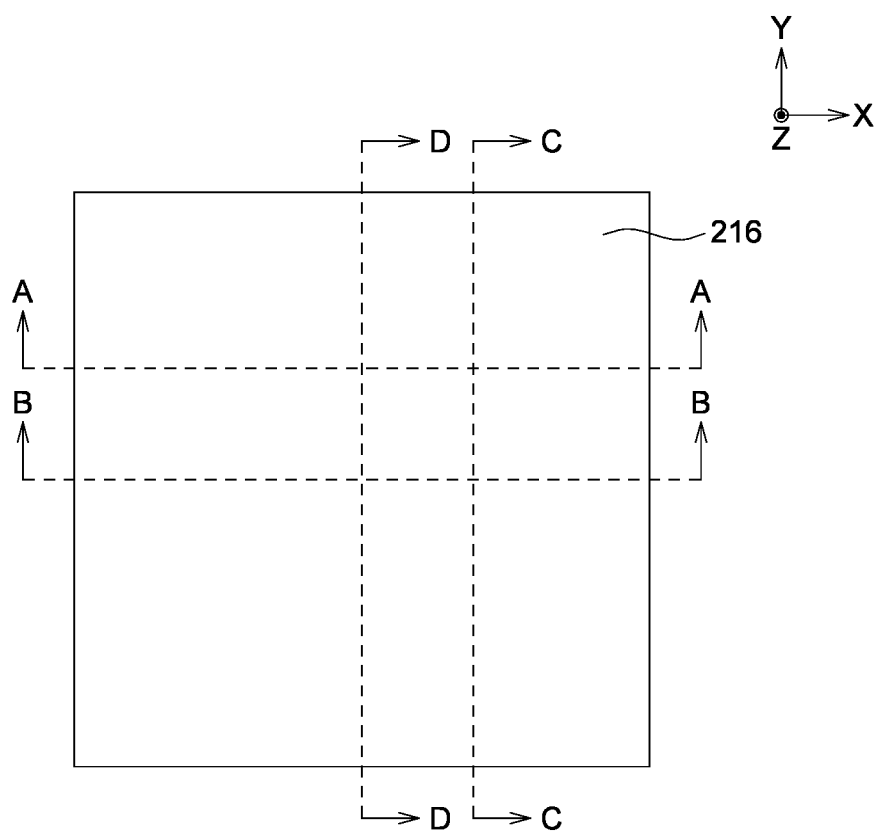
Figure 12B:
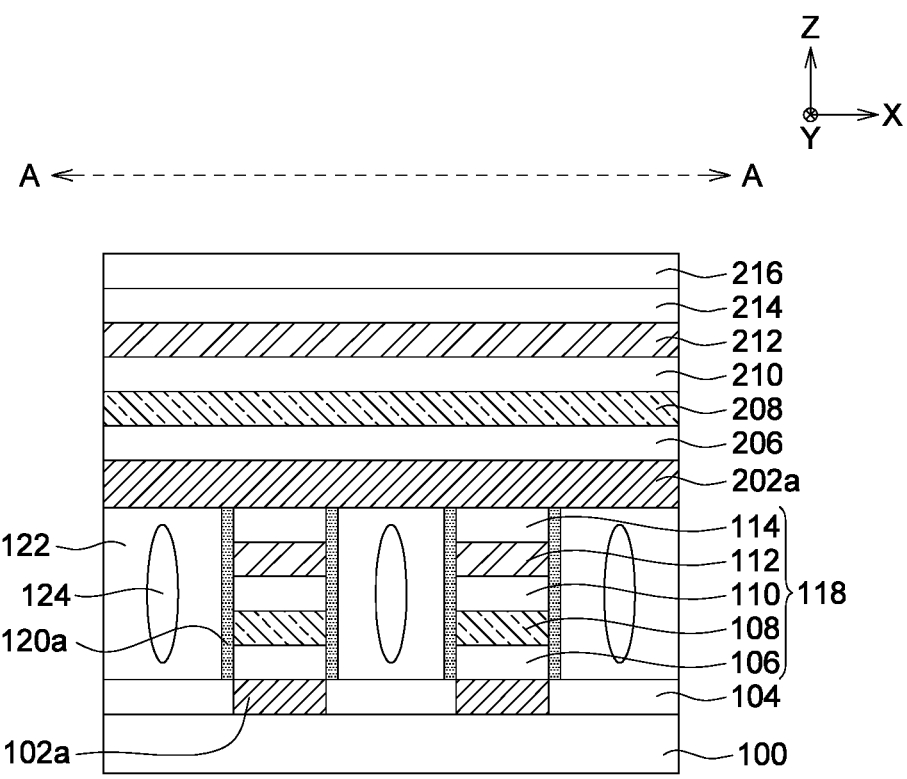
Figure 12C:
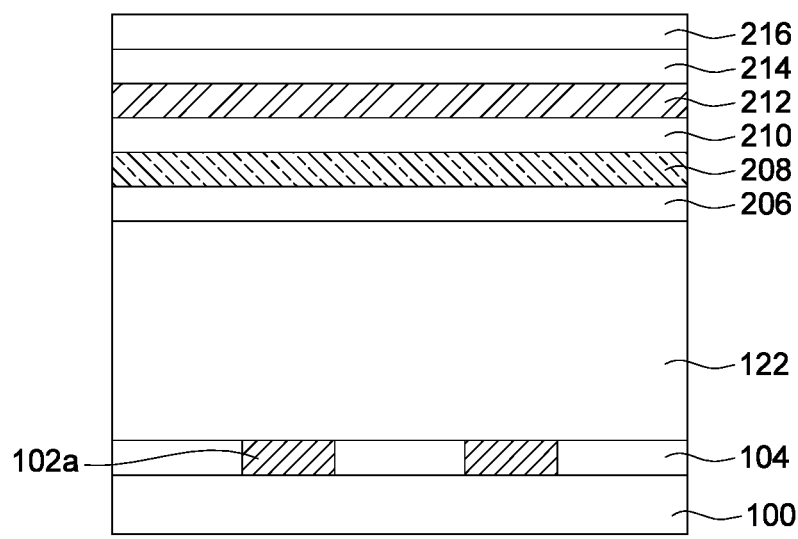
Figure 12D:
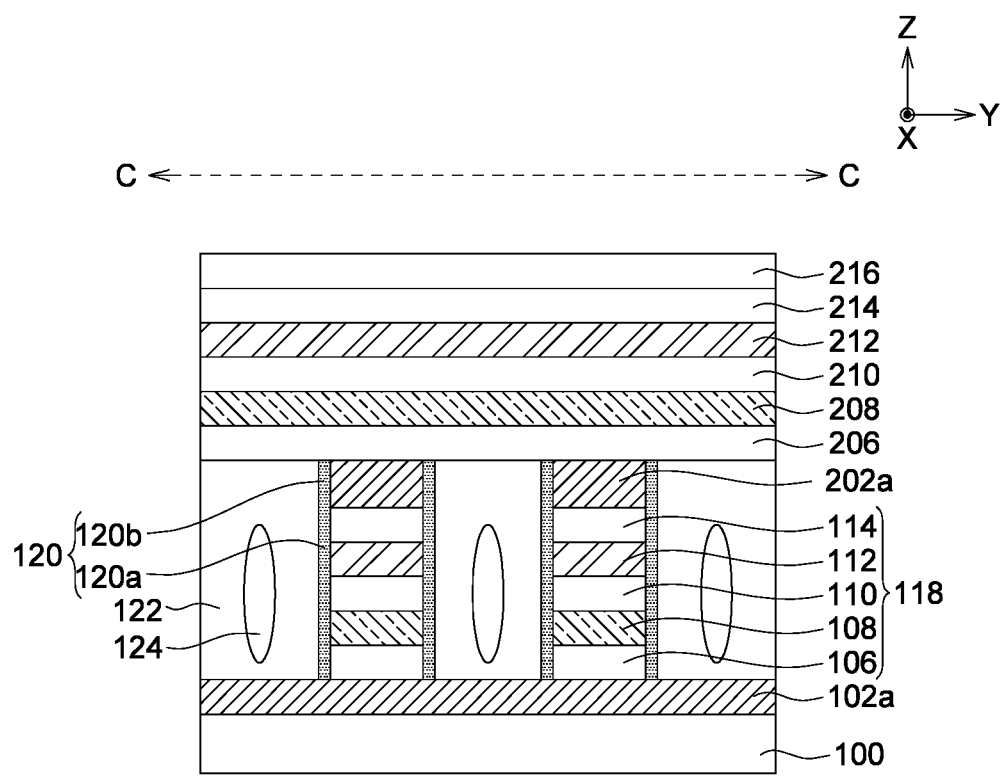
Figure 12E:
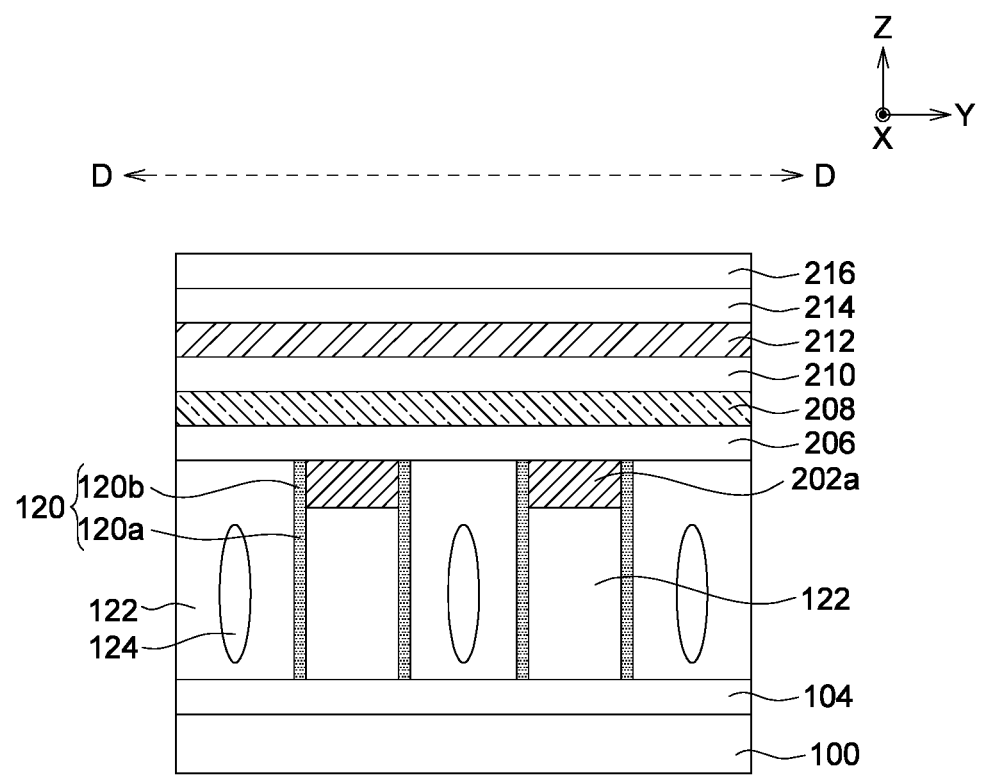
Figure 13A:
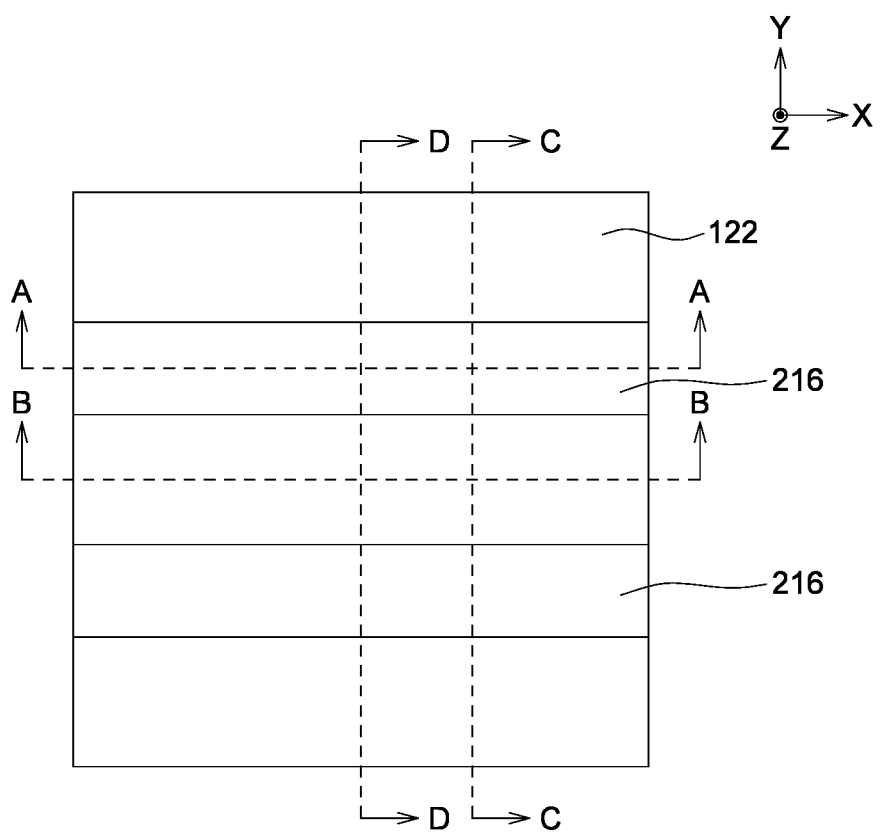
Figure 13B:
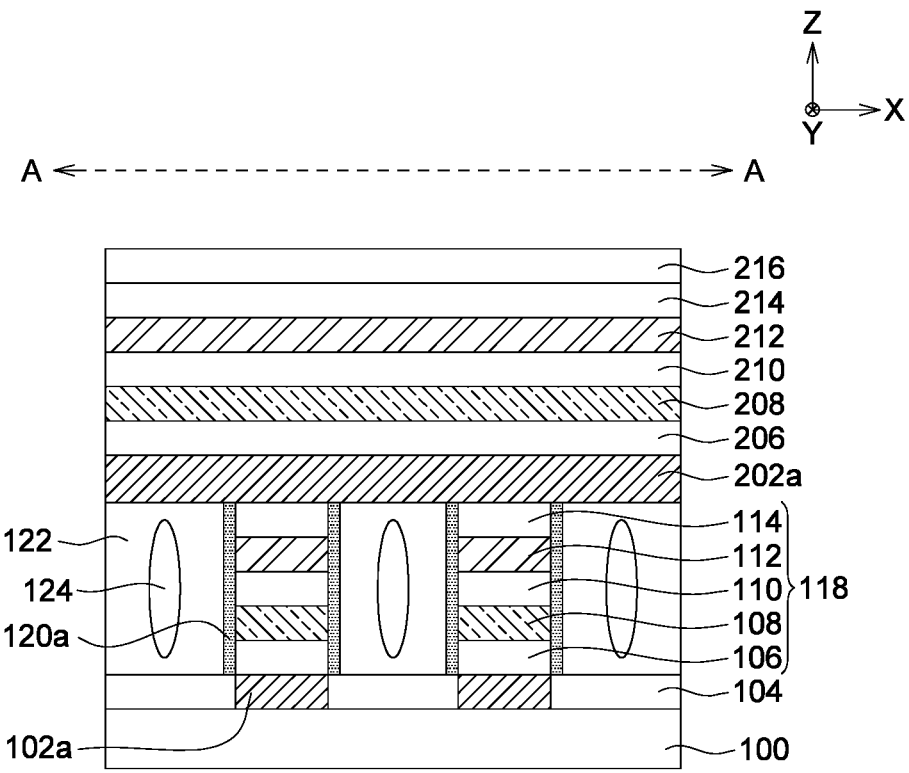
Figure 13C:
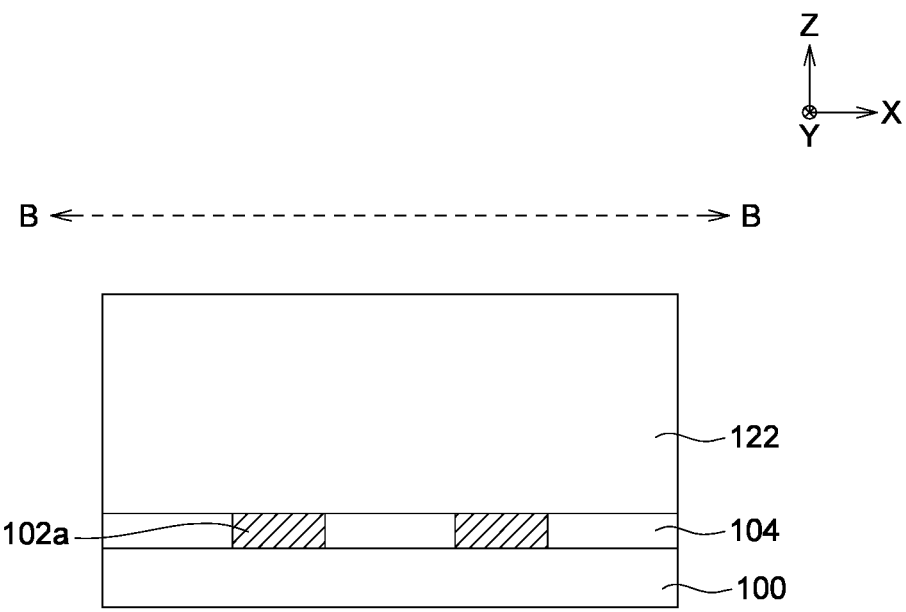
Figure 13D:
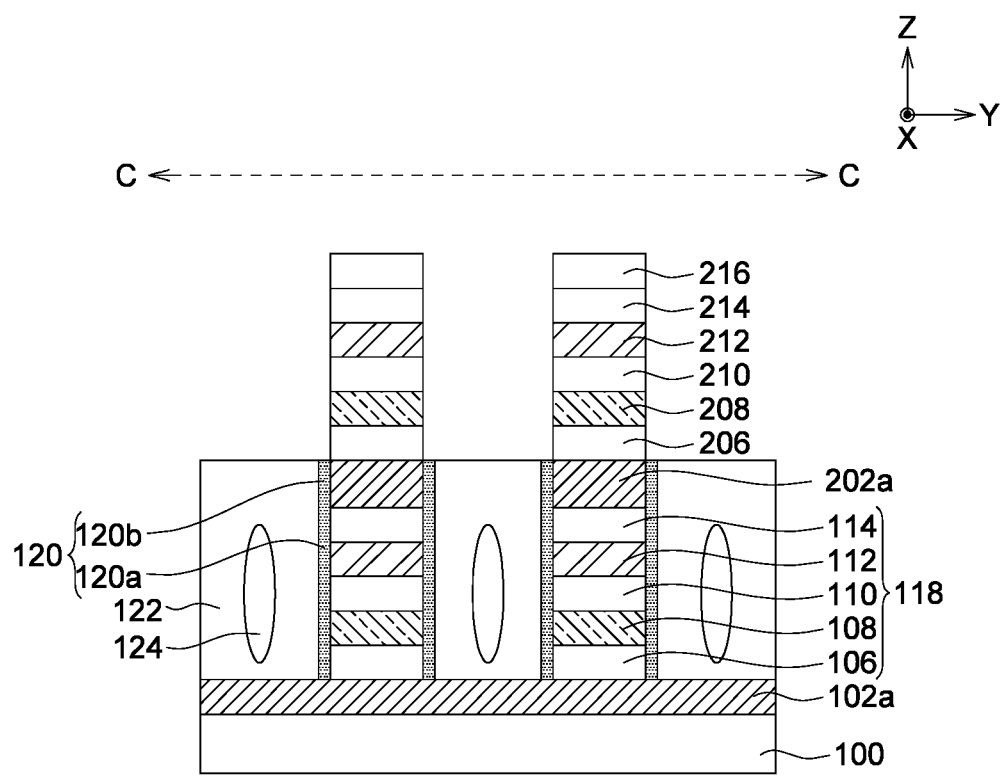
Figure 13E:
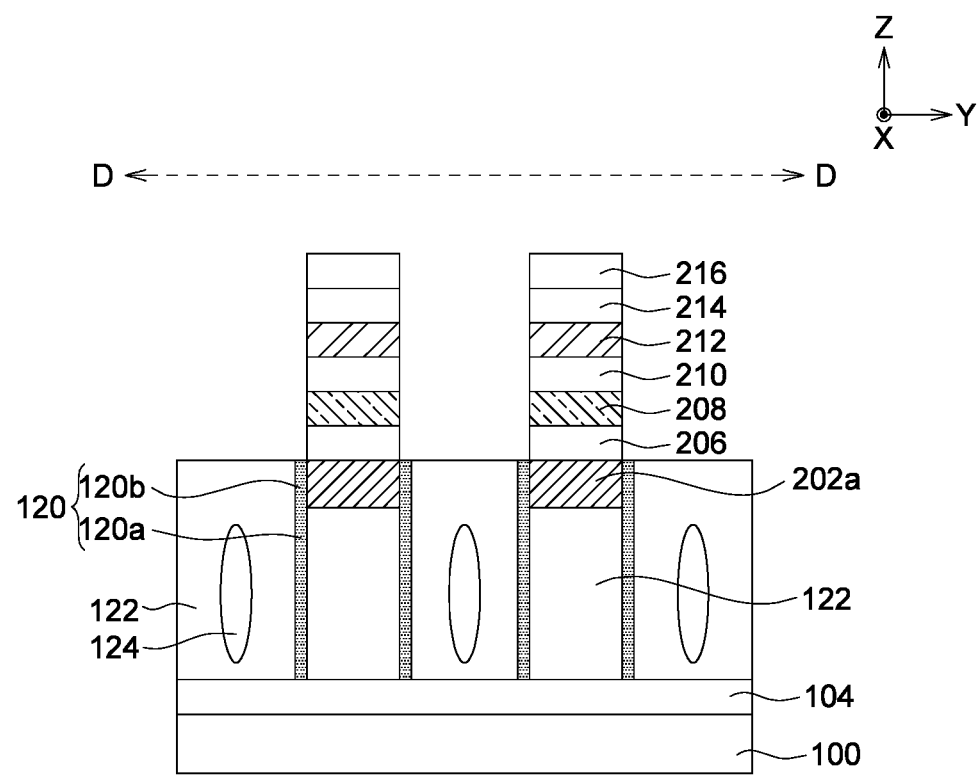
Figure 14A:
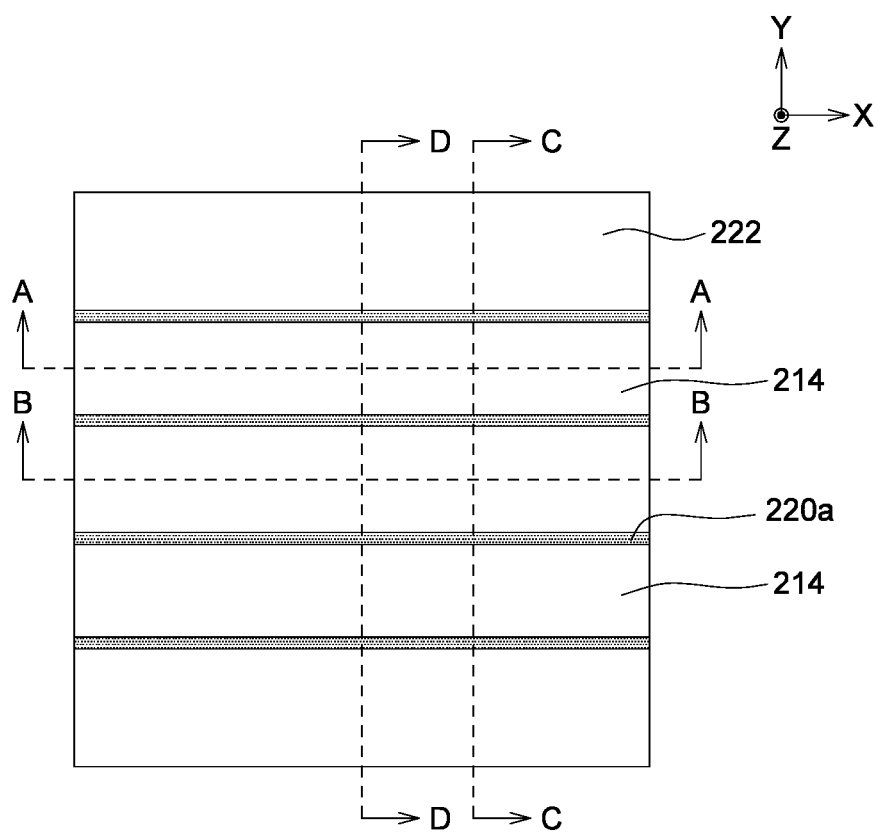
Figure 14B:
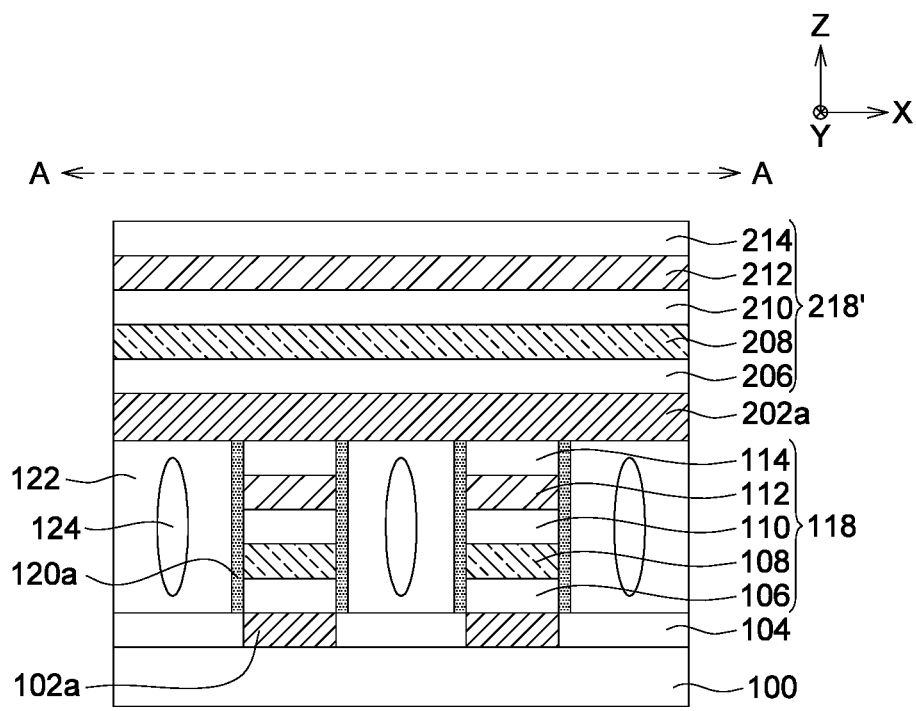
Figure 14C:
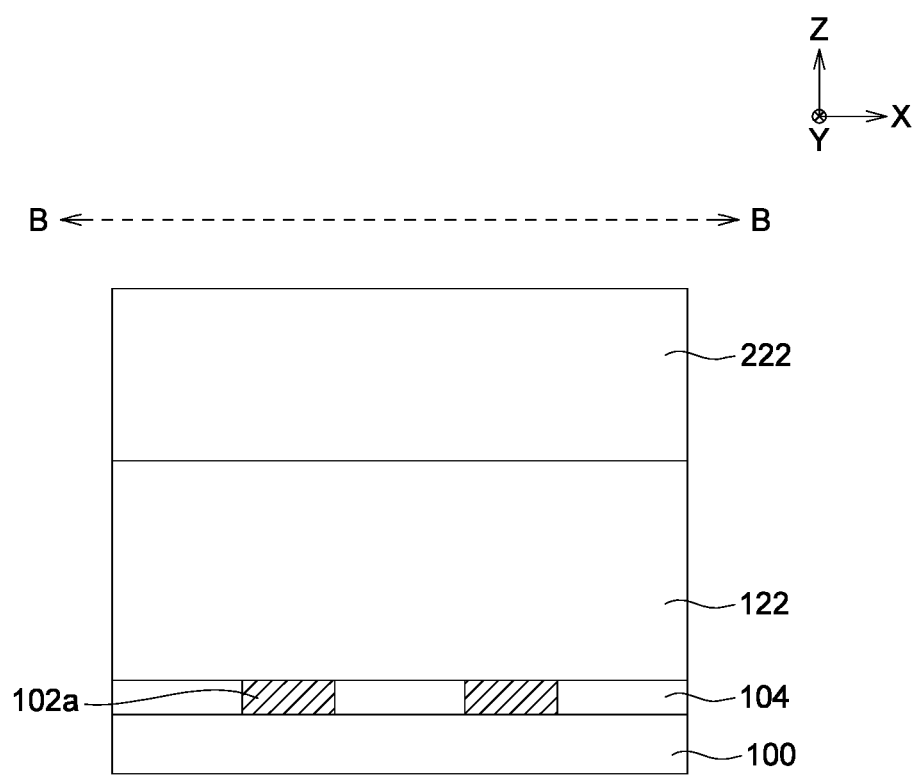
Figure 14D:
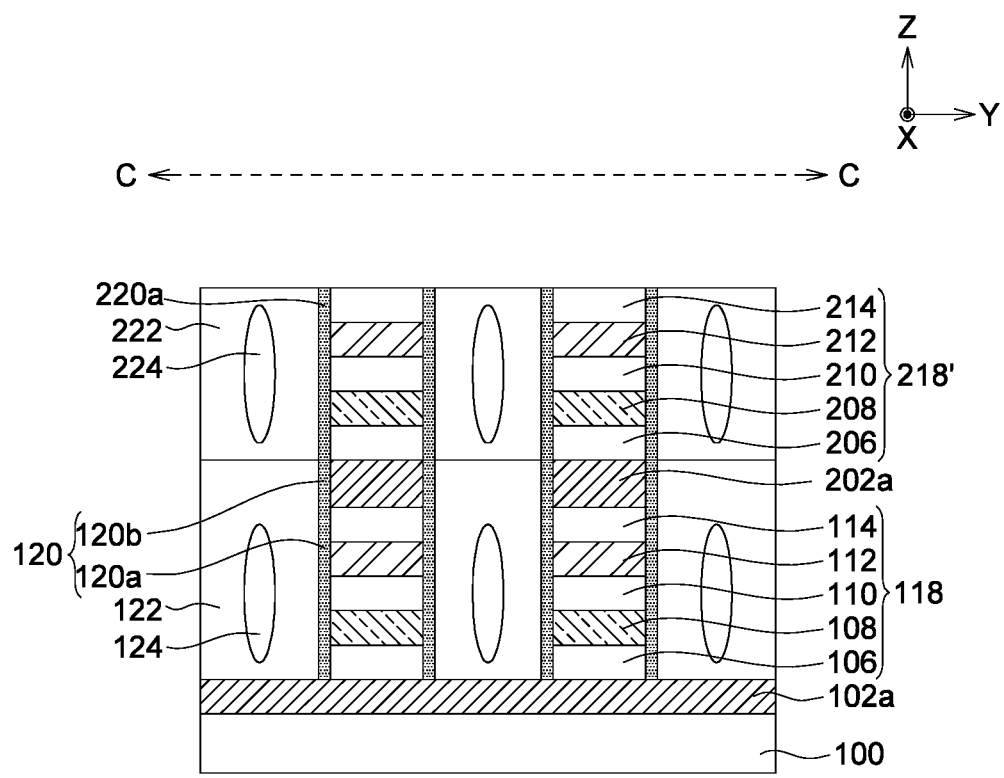
Figure 14E:
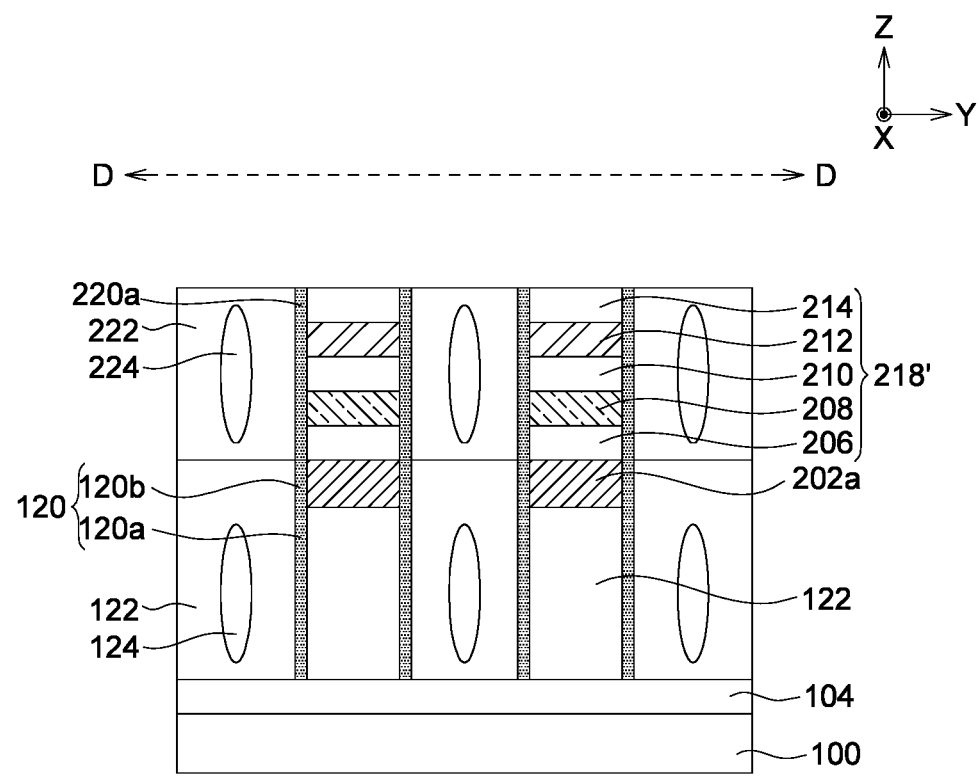
Figure 15A:
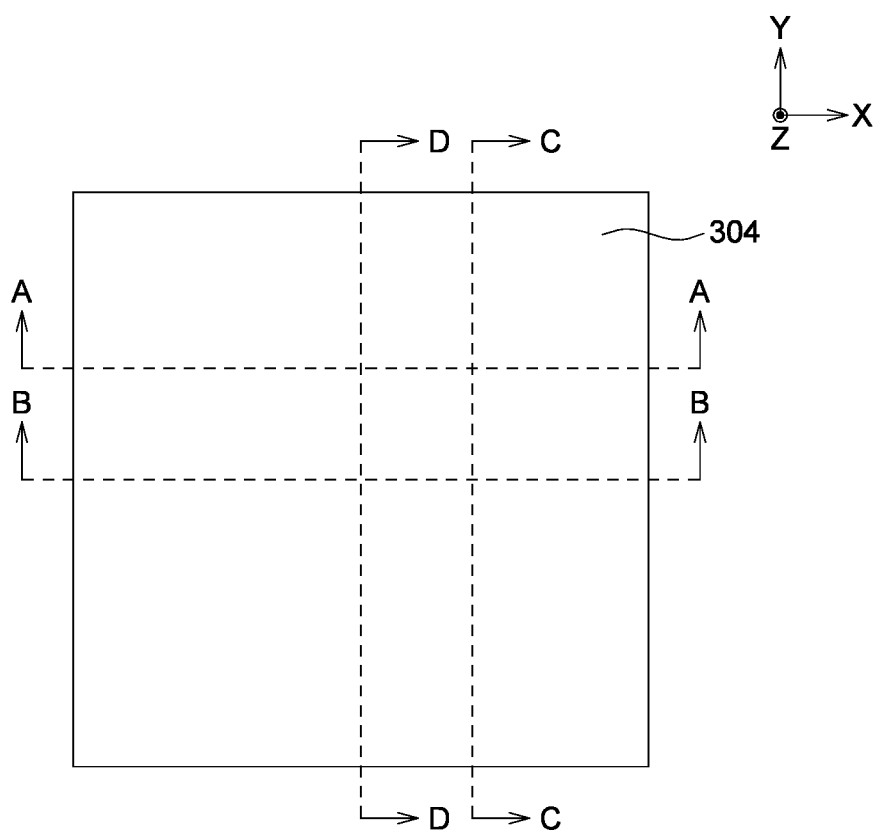
Figure 15B:
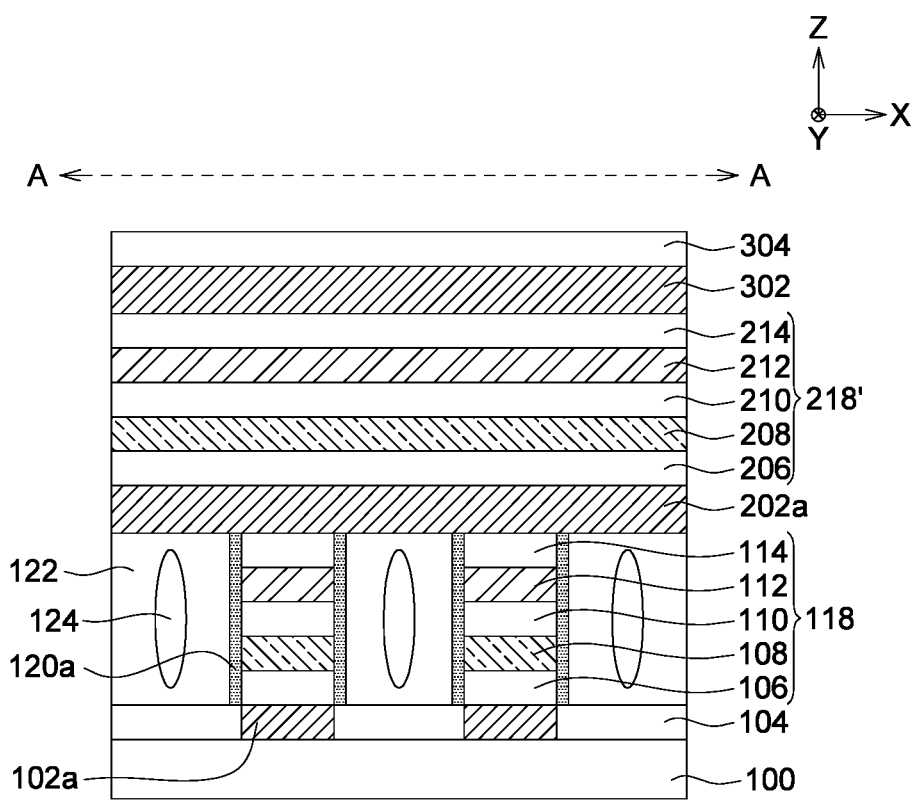
Figure 15C:
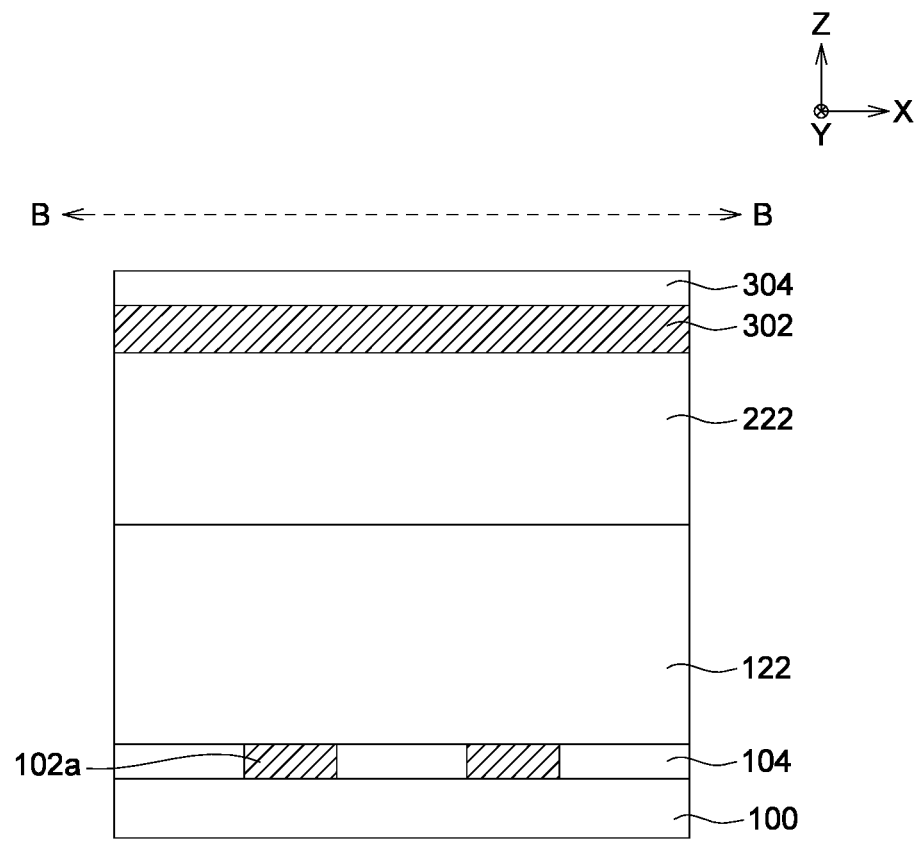
Figure 15D:
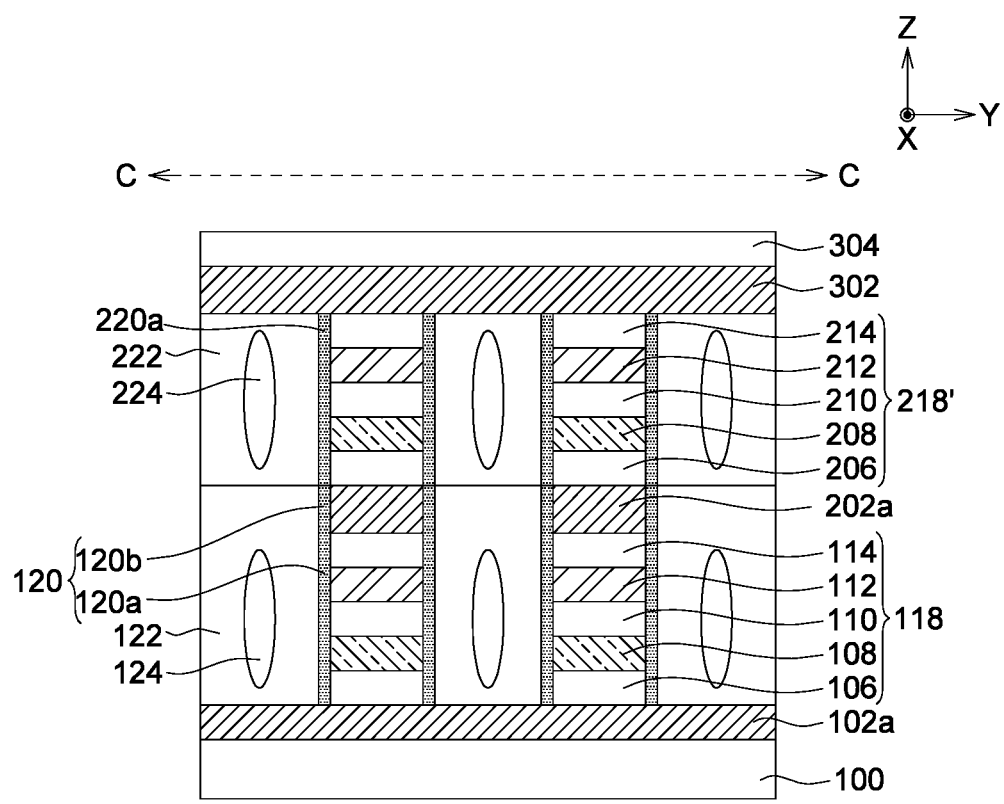
Figure 15E:
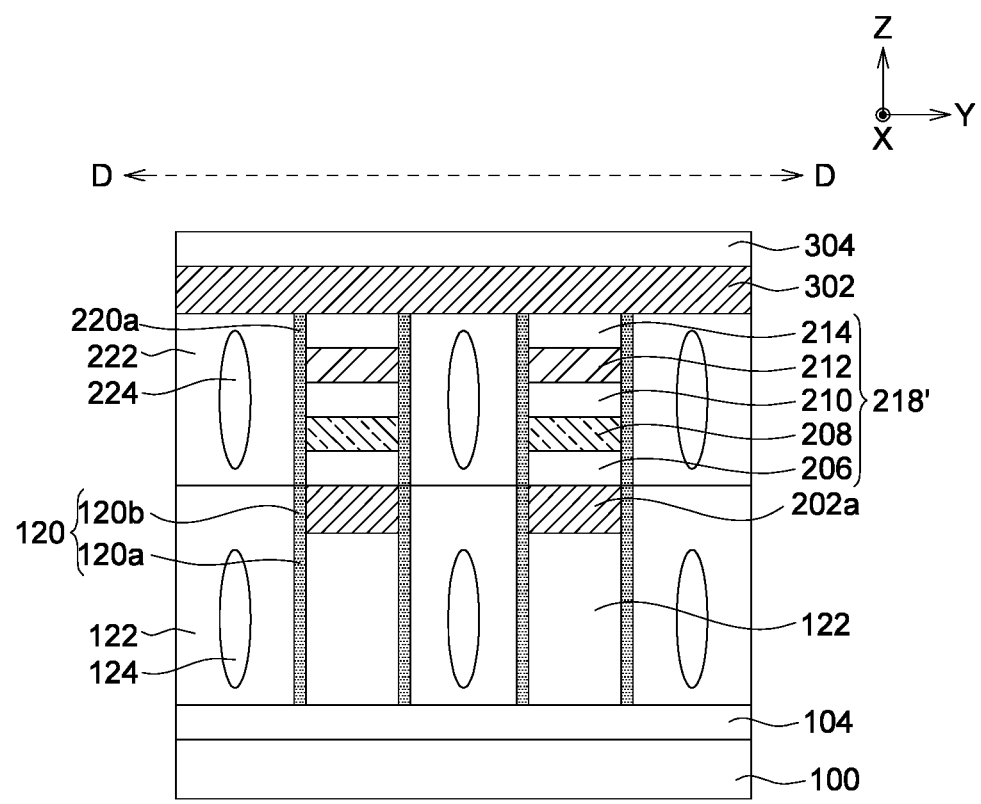
Figure 16A:
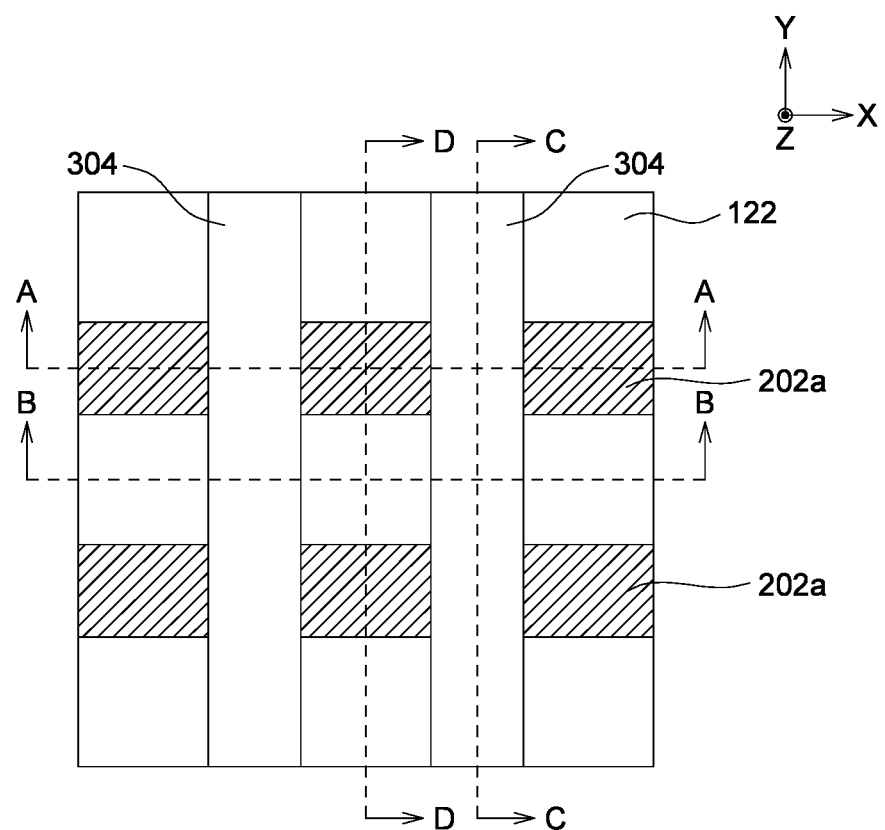
Figure 16B:
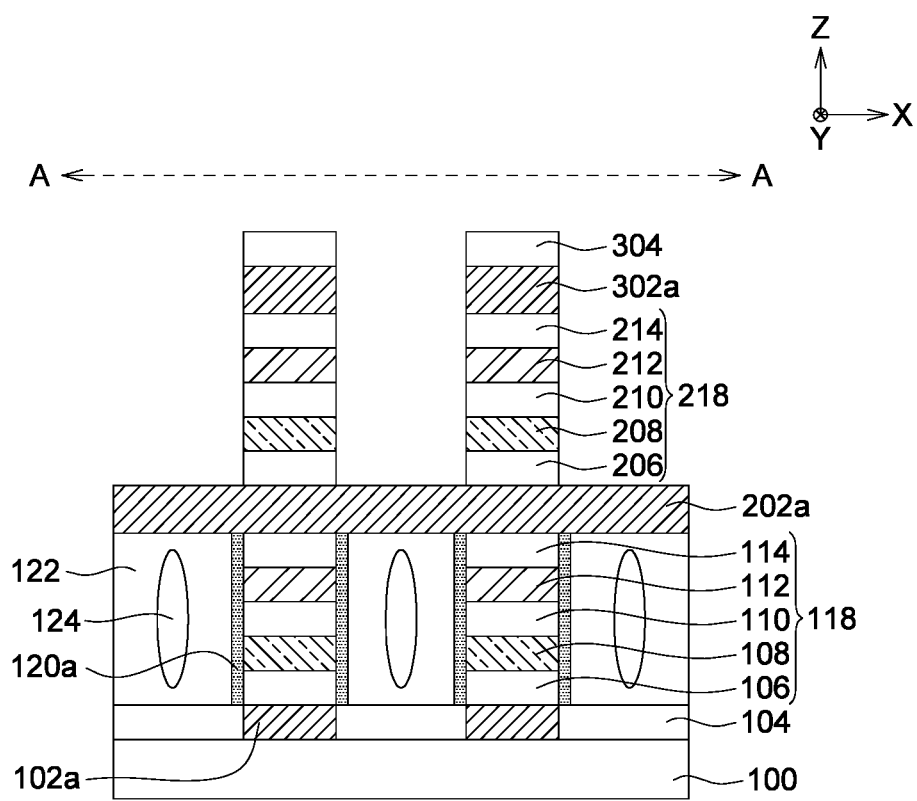
Figure 16C:
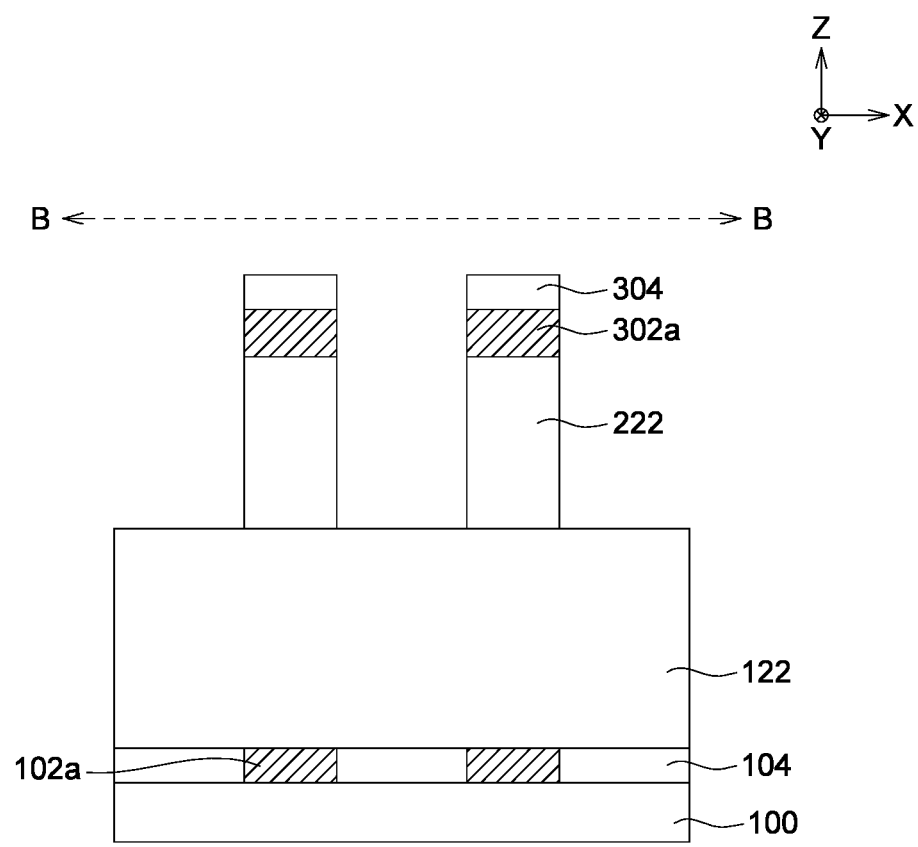
Figure 16D:
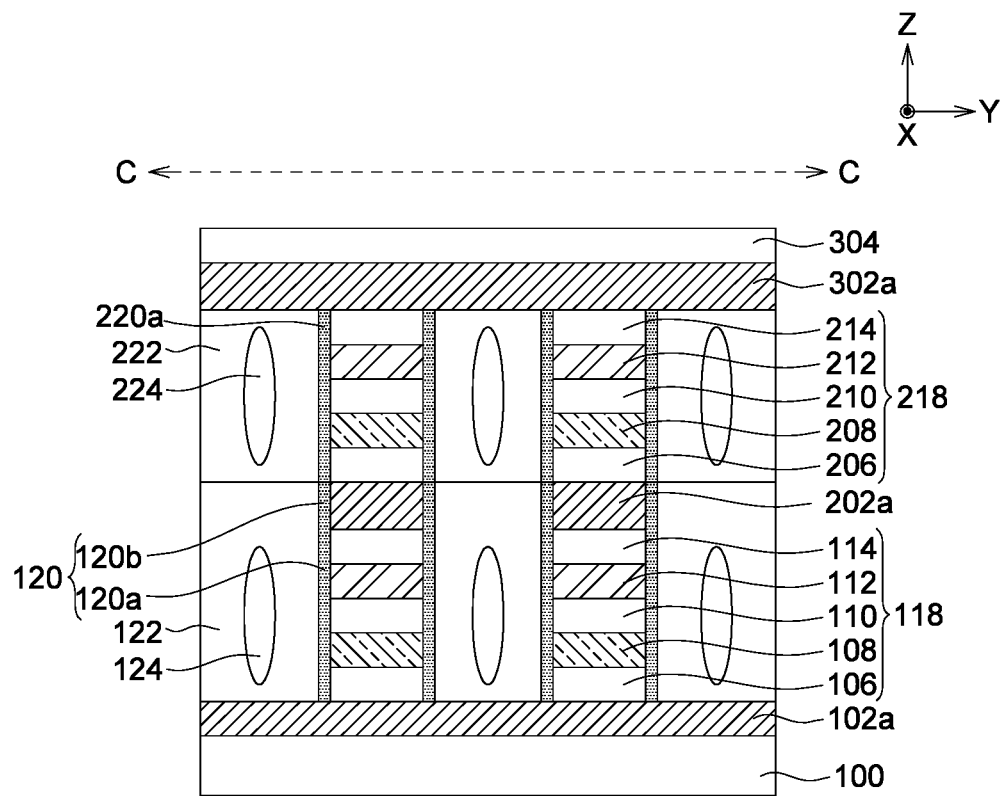
Figure 16E:
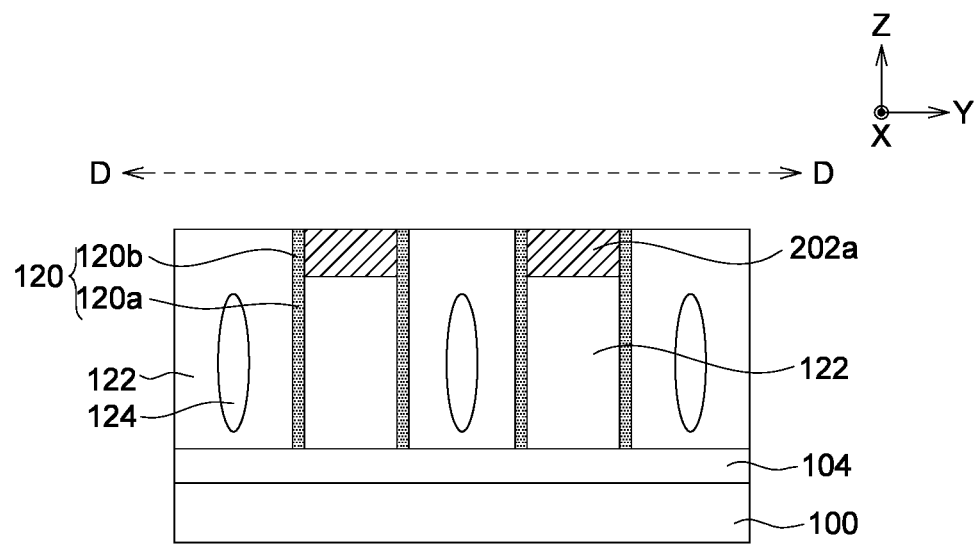
Figure 17A:
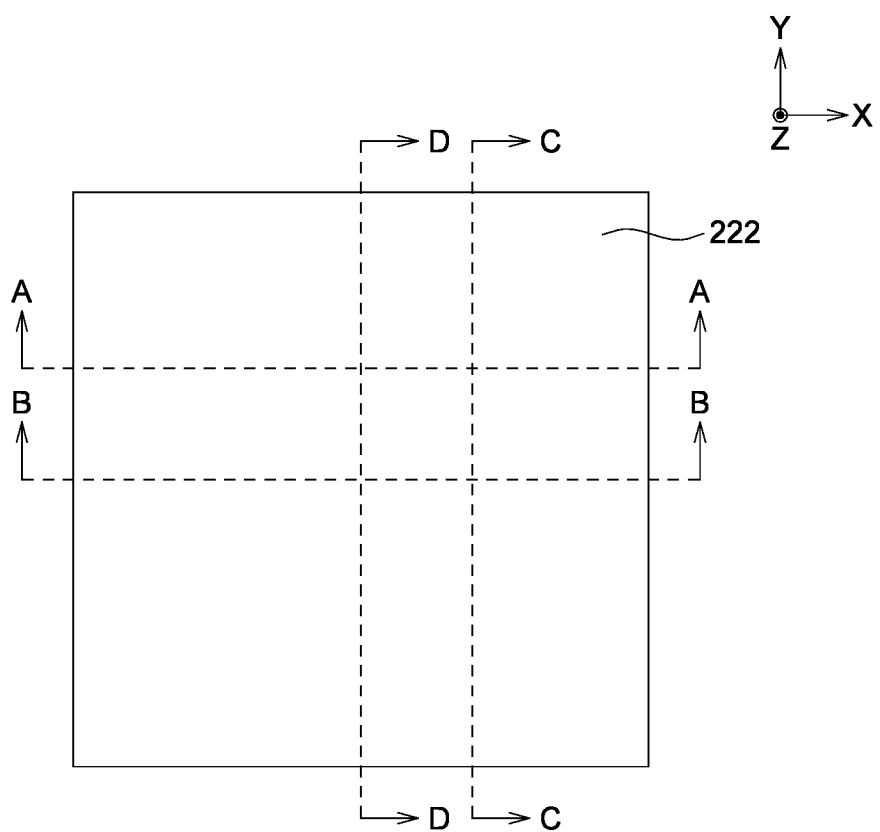
Figure 17B:
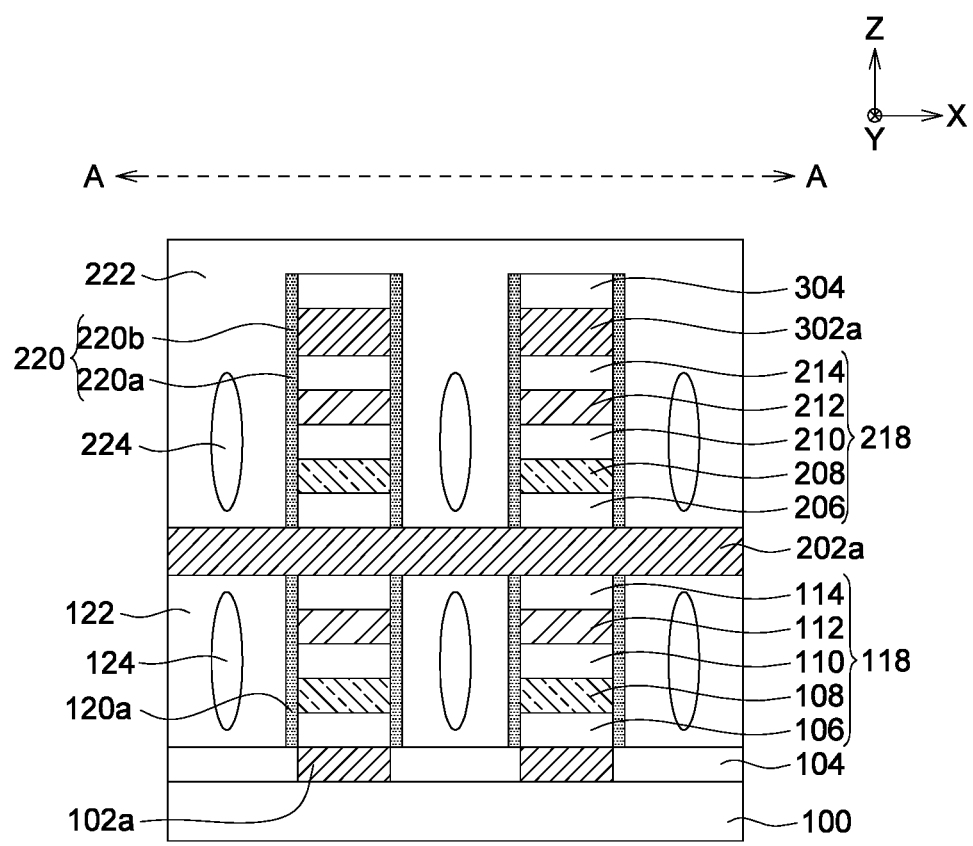
Figure 17C:
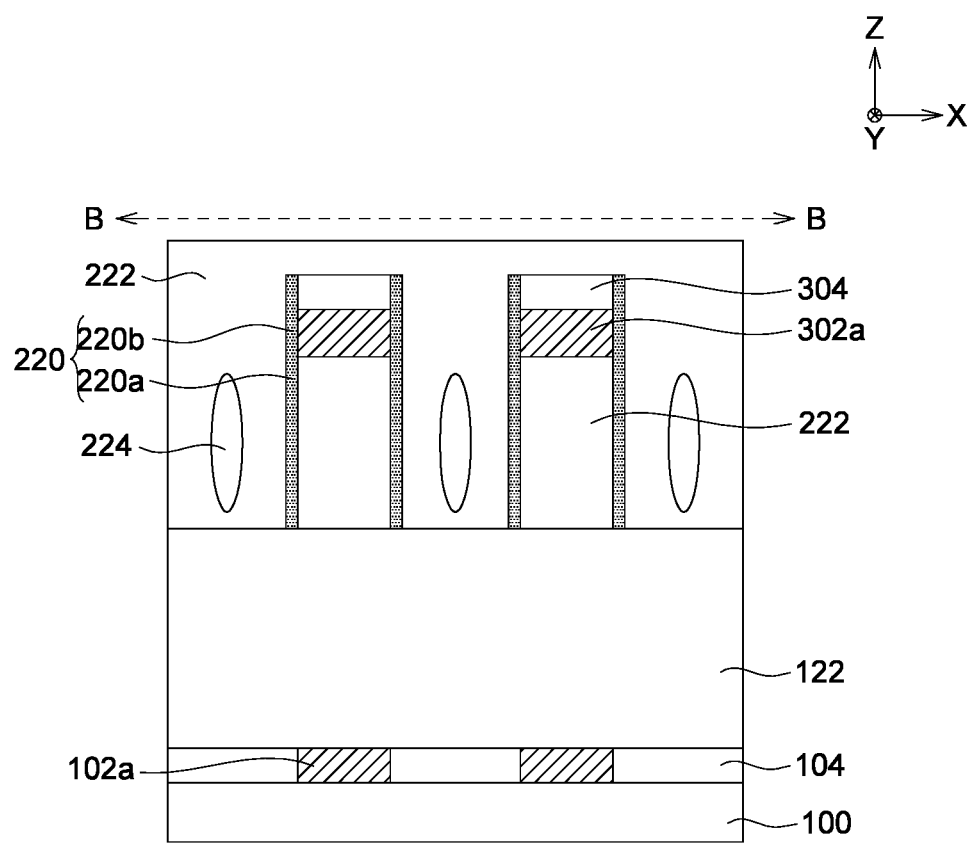
Figure 17D:
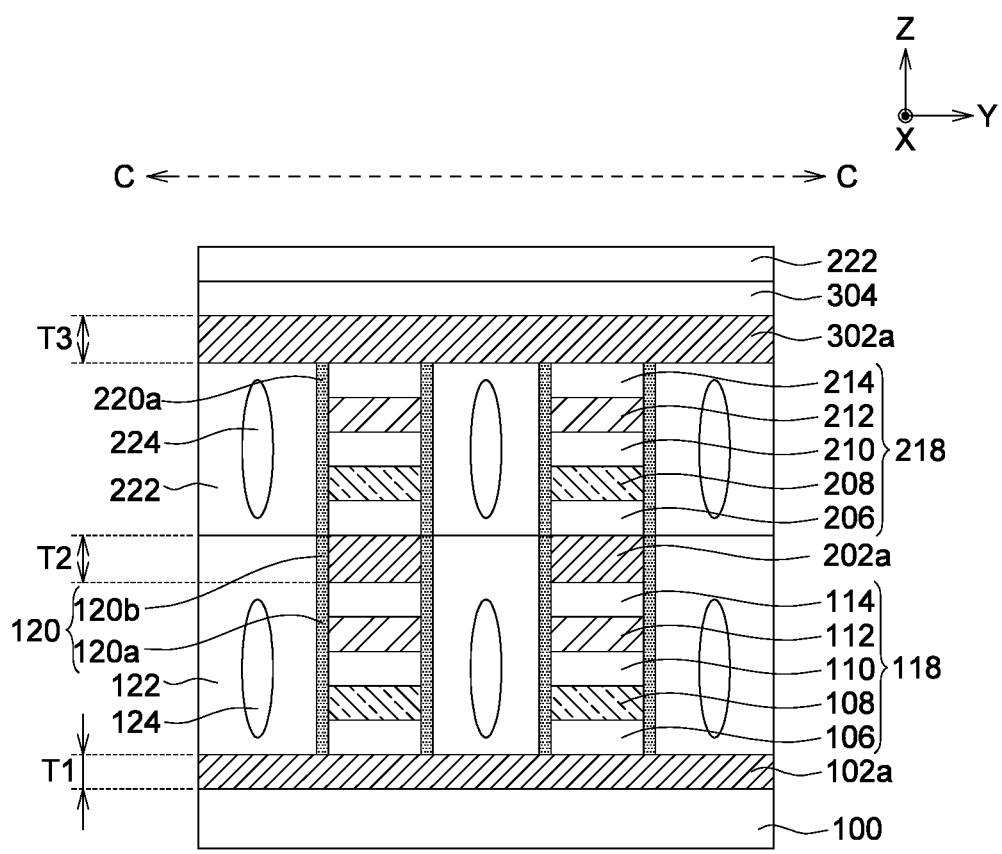
Figure 17E:
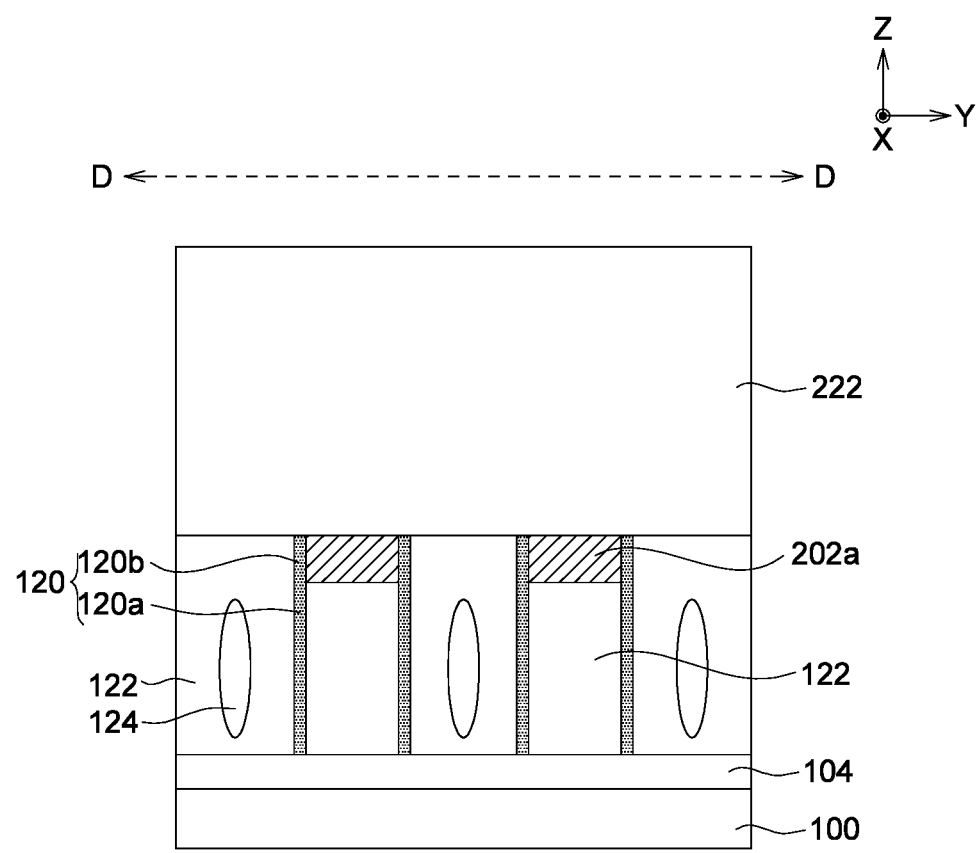

Referring to FIGS. 11A-11E at the same time, the second spacers 120b surrounding the second conductive stripes 202a are formed by a deposition process. Similar to steps described above, the dielectric material is first conformally deposited on the first conductive stripes 102a, the insulating material 104, the first pillar elements 118, the insulating material 122, the second conductive stripes 202a, and the mask layer 204, and then a portion of the dielectric material is removed by an etching process, and the remaining dielectric material forms second spacers 120b on the sidewalls of the second conductive stripes 202a, and then the insulating material 122 is formed in the spaces between the first spacers 120a, between the second spacers 120b and on the mask layer 204a by the deposition process; then a portion of the insulating material 122 and a portion of the second spacers 120b are removed by a chemical mechanical polishing process, and the mask layer 204 is completely removed to expose the top surfaces of the second conductive stripes 202a. The top surfaces of the second conductive stripes 202a, the top surfaces of the second spacers 120b, and the top surfaces of the insulating material 122 may be coplanar, as shown in FIGS. 11D and 11E. The first spacer 120a and the second spacer 120b form a spacer 120 together which surrounds the first pillar element 118 and the second conductive stripe 202a.

As shown in FIGS. 11B and 11D, a thickness T2 of the second conductive stripe 202a may be greater than a thickness T1 of the first conductive stripe 102a. For example, the thickness T2 of the second conductive stripe 202a may be twice the thickness T1 of the first conductive stripe 102a, but the present invention is not limited thereto. The second conductive stripe 202a is an integral structure formed by a single etching process. That is, the second conductive stripe 202a is not formed by different deposition processes, so there will be no interface formed inside the second conductive stripe 202a, and there will be no misalignment between the upper layer and the lower layer inside the second conductive stripe 202a.

Referring to FIGS. 12A to 12E at the same time, the first buffer layer 206, the switching layer 208, the second buffer layer 210, the memory layer 212, the third buffer layer 214, and the mask layer 216 in the second level L2 are sequentially formed on the second conductive stripes 202a and the insulating material 122 by a deposition process.

Referring to FIGS. 13A to 13E at the same time, the first buffer layer 206, the switching layer 208, the second buffer layer 210, the memory layer 212, the third buffer layer 214, and the mask layer 216 in the second level L2 are patterned. For example, a portion of the first buffer layer 206, a portion of the switching layer 208, a portion of the second buffer layer 210, a portion of the memory layer 212, a portion of the third buffer layer 214, and a portion of the mask layer 216 are removed by an etching process (that is, removing the first buffer layer 206, the switching layer 208, the second buffer layer 210, the memory layer 212, the third buffer layer 214, and the mask layer 216 which are not overlapped with the second conductive stripes 202a in the third direction) to expose a portion of the upper surface of the insulating material 122; so that the patterned (i.e. remaining) first buffer layers 206, switching layers 208, second buffer layers 210, memory layers 212, third buffer layers 214, and mask layers 216 have the same or similar profile to the profile of the second conductive stripes 202a, and overlap the second conductive stripes 202a in the third direction, and the etching process is, for example, reactive ion etching. Since the etching step of patterning the switching layer 208 and the memory layer 212 is performed after the etching step for forming the second conductive stripes 202a and stops above the second conductive stripes 202a, the switching layer 208 and the memory layer 212 are not damaged by the etchant used for forming the second conductive stripe 202a in the etching process.

Referring to FIGS. 14A-14E at the same time, first spacers 220a surrounding the first buffer layers 206, the switching layers 208, the second buffer layers 210, the memory layers 212, the third buffer layers 214, and the mask layers 216 in the second level L2 are formed. In detail, the dielectric material is conformally deposited on surfaces of the insulating material 122 and the first buffer layers 206, the switching layers 208, the second buffer layers 210, the memory layers 212, the third buffer layers 214, and the mask layers 216 in the second level L2, as shown in FIGS. 13A to 13E, by a deposition process, and then a portion of the dielectric material is removed by an etching process, and first spacers 220a are formed on the sidewalls of the first buffer layers 206, the switching layers 208, the second buffer layers 210, the memory layers 212, the third buffer layers 214, and the mask layers 216 in the second level L2 by the remaining dielectric material. The first spacers 220a directly contact the first buffer layers 206, the switching layers 208, the second buffer layers 210, the memory layers 212, and the third buffer layers 214. Thereafter, an insulating material 222 is formed in the space between the first spacers 220a and on the mask layer 216 by a deposition process, and the insulating material 222 can form air gaps 224 between the first spacers 220a. The air gaps 224 can improve thermal efficiency. Afterwards, a portion of the insulating material 222 and a portion of the first spacer 220a are removed by a chemical mechanical polishing process, and the mask layer 216 is completely removed to expose top surfaces of the third buffer layers 214 in the second level L2. In this way, second film stacks 218' corresponding to the shape of the second conductive stripes 202a and overlapping the second conductive stripes 202a in the third direction are formed. The first spacers 220a surround the second film stacks 218'.

In an embodiment, the dielectric material (that is, the material of the first spacers 220a) may be a nitride, such as silicon nitride (SiN). Similarly, since the present invention does not require the first spacers 220a to protect the switching layer 208 and the memory layer 212 from being damaged by the etchant used for forming the second conductive stripes 202a in the etching process. In other embodiments, the first spacers 220a may be omitted. The material of the insulating material 222 is, for example, an oxide with a low dielectric constant.

Referring to FIGS. 15A to 15E at the same time, a third conductive layer 302 and a mask layer 304 are sequentially formed on the second film stacks 218', the first spacers 220a and the insulating material 222 by a deposition process.

Referring to FIGS. 16A to 16E at the same time, a portion of the third conductive layer 302 and a portion of the mask layer 304 are removed by a third etching process, that is, the third conductive layer 302 is patterned to form a plurality of third conductive stripes 302a respectively extending in the first direction and separated from each other in the second direction, and after patterning the third conductive layer 302 (that is, the third etching process), a portion of the film stacks 218', a portion of the first spacers 220a, and a portion of the insulating material 222 are removed by a fourth etching process, to expose a portion of the second conductive stripes 202a and the insulating material 122 (that is, exposing the second conductive stripes 102a and the insulating material 122 that do not overlap the third conductive stripes 302a in the third direction). After the steps of the third etching process and the fourth etching process, the second film stacks 218' disposed at the intersections between the second conductive stripes 202a and the third conductive stripes 302a are remained to form second pillar elements 218 corresponding to the second level L2 of the memory device 10. The etching process is, for example, reactive ion etching. The extension direction of the third conductive stripes 302a is, for example, perpendicular to the extension direction of the second conductive stripes 202a, and the extension direction of the third conductive stripes 302a is, for example, the same as the extension direction of the first conductive stripes 102a. The third conductive stripes 302a and the first conductive stripes 102a may completely overlap each other in the third direction. Similarly, since the fourth etching process is performed after the third etching process, and the fourth etching process is stopped above the second conductive stripes 202a, it is not necessary to etch the conductive stripes (for example, the second conductive stripes 202a or the third conductive stripes 302a) during or after the etching of the switching layers 208 and the memory layers 212, so the etchant used to pattern the conductive stripes will not damage the switching layers 208 and the memory layers 212.

Referring to FIGS. 17A-17E at the same time, the first spacers 220a surrounding the second pillar elements 218 and the second spacers 220b surrounding the third conductive stripes 302a are formed by the deposition process. Similar to the steps stated above, first, a dielectric material is conformally deposited on the second conductive stripes 102a, the insulating material 122, the second pillar elements 218, the insulating material 222, the third conductive stripes 302a, the mask layers 304, as shown in FIGS. 16A-16E, and then a portion of the dielectric material is removed by an etching process, first spacers 220a are formed on the sidewalls of the second pillar elements 218 and the second spacers 220b are formed on the sidewalls of the third conductive stripes 302a by the remaining dielectric material. Thereafter, an insulating material 222 is formed in the space between the first spacers 220a, between the second spacers 220b and on the mask layer 304 by a deposition process, and then a portion of the insulating material 222 and a portion of the second spacers 220b are removed, and the mask layers 304 are completely removed by the chemical mechanical polishing process, to expose the top surfaces of the third conductive stripes 202a (not shown). The top surfaces of the third conductive stripes 302a, the top surfaces of the second spacers 220b, and the top surfaces of the insulating material 222 may be coplanar (not shown). The first spacer 220a and the second spacer 220b form a spacer 220 together which surround the second pillar elements 218 and the third conductive stripes 302a. FIGS. 1A-17E exemplarily illustrate the manufacturing process of the first level L1 and the second level L2 of the memory device 10, and the similar steps of processes can be followed to form the third level and more levels above the second level L2, for the convenience of description, the steps of forming the third level and more levels are omitted.

In the present embodiment, the third conductive stripes 302a are the middle-level conductive stripes in the memory device 10 instead of the top-level conductive stripe, and a thickness T3 of the third conductive stripes 302a may be greater than a thickness T1 of the first conductive stripes 102a, and may be equal to a thickness T2 of the second conductive stripes 202a. In other embodiments, the third conductive stripes 302a are the topmost—level of conductive stripes in the memory device 10, and a thickness T3 of the third conductive stripes 302a can be equal to the thickness T1 of the first conductive stripes 102a and can be smaller than the second thickness T2 of the second conductive stripes 202a.

According to the above contents regarding the flowchart of manufacturing process in FIGS. 1A-17E, the memory device 10 shown in FIG. 18 is formed. In FIG. 18, the insulating materials 122 and 222 and the air gaps 124 and 224 are omitted to make the figure more clear.

Referring to FIG. 18, the memory device 10 includes a substrate 100, a plurality of first conductive stripes 102a, a plurality of second conductive stripes 202a, a plurality of third conductive stripes 302a, a plurality of first pillar elements 118, a plurality of second pillar elements 218 and a plurality of spacers 120 and 220 are provided. In addition, the memory device 10 further includes insulating materials 122 and 222 and air gaps 124 and 224 (not shown in FIG. 18). The first conductive stripes 102a are disposed on the substrate 100 and respectively extend along a first direction (for example, Y direction), and are separated from each other along a second direction (for example, X direction). The second conductive stripes 202a are disposed on the first conductive stripes 102a and the first pillar elements 118 and respectively extend along the second direction, and are separated from each other along the first direction (for example, Y direction). The first direction and the second direction are parallel to the upper surface of the substrate 100, and the second direction and the first direction are intersected. A thickness T2 of the second conductive stripes 202a is greater than a thickness T1 of the first conductive stripes 102a, and each of the first conductive stripes 102a, the second conductive stripes 202a, and the third conductive stripes 302a is an integral structure, and there is no interface between upper and lower layers inside, and there is no misalignment between the upper and lower layers inside. The thickness T2 can be twice the thickness T1, for example, the thickness T1 is 40 nm, and the thickness T2 is between 80 nm and 120 nm, but the present invention is not limited thereto.

In an embodiment, the first conductive stripes 102a and the third conductive stripes 302a can be respectively used as a word line, and the second conductive stripes 202a can be respectively used as a bit line, but the present invention is not limited thereto. In the memory device 10, since the conductive stripes corresponding to the middle level (for example, the second conductive stripes 202a) may have a greater thickness than the thickness of the conductive stripes at the bottom level or top level (for example, the first conductive stripes 102a), the conductive stripes in the middle level (for example, the second conductive stripes 202a) can have lower bit line resistance or word line resistance.

The first pillar elements 118 are disposed at the intersections between the first conductive stripes 102a and the second conductive stripes 202a, and are respectively extend from the top surfaces of the first conductive stripes 102a to the bottom surfaces of the second conductive stripes 202a along the third direction (for example, Z direction), and the third direction is intersected with the first direction and the second direction. For example, the third direction, the first direction and the second direction are perpendicular to each other. The second pillar elements 218 are disposed at the intersections between the second conductive stripes 202a and the third conductive stripes 302a, and respectively extend from the top surfaces of the second conductive stripes 202a to the bottom surfaces of the conductive stripes 302a along the third direction (for example, Z direction). The first pillar elements 118 and the second pillar elements 218 may overlap each other in the third direction, and the sidewalls of the first pillar elements 118 and the second pillar elements 218 may be aligned with each other.

Each of the first pillar elements 118 includes a first buffer layer 106 a switching layer 108, a second buffer layer 110, a memory Layer 112 and a third buffer layer 114 corresponding to a first level L1 and sequentially stacked on the first conductive stripe 102a. Each of the second pillar elements 218 includes a first buffer layer 206, a switching layer 208, a second buffer layer 210, a memory layer 212, and a third buffer layer 214 corresponding to a second level L2 and sequentially stacked on the second conductive stripe 202a. In the first level L1, the first buffer layer 106 is disposed between the first conductive stripe 102a and the switching layer 108, the second buffer layer 110 is disposed between the switching layer 108 and the memory layer 112, and the third buffer layer 114 is disposed between the memory layer 112 and the second conductive stripe 202a. In the second level L2, the first buffer layer 206 is disposed between the second conductive stripe 202a and the switching layer 208, the second buffer layer 210 is disposed between the switching layer 208 and the memory layer 212, and the third buffer layer 214 is disposed between the memory layer 212 and the third conductive stripe 302a.

The spacer 120 surrounds and directly contacts the first pillar element 118. In detail, an inner side of the spacer 120 directly contacts the first buffer layer 106, the switching layer 108, the second buffer layer 110, the memory layer 112, the third buffer layer 114 and the second conductive stripe 202a, and an outer side of the spacer 120 directly contacts the insulating material 122 (not shown in FIG. 18). Similarly, the spacer 220 surrounds and directly contacts the second pillar element 218. In detail, an inner side of the spacer 220 directly contacts the first buffer layer 206, the switching layer 208, the second buffer layer 210, the memory layer 212, the third buffer layer 214 and the third conductive stripe 302a, and an outer side of the spacer 220 directly contacts the insulating material 222 (not shown in FIG. 18).

In the present embodiment, the spacers 120 and 220 have a single-layer structure, respectively. The material of the spacers 120 and 220 may include nitride (for example, silicon nitride) The thickness of the spacers 120 and 220 is between 2 nm and 5 nm. It should be understood that the present invention is not limited thereto. Compared with a comparative example that requires a multi-layered spacer to protect the switching layer and memory layer from being damaged by the etchant used to form the conductive stripes (word lines or bit lines) in the etching step, the switching layer and memory layer in the present invention does not need to be protected by additional spacers during the etching process to form the conductive stripes, so the spacers 120 and 220 in the present invention can have a smaller thickness, which is more beneficial to the miniaturization of memory devices, and is quite suitable for applications of memory device with small pitches. The arrangement of the spacers 120 and 220 in the present invention is to enable the memory device 10 to have better electrical properties, for example, to enable the memory layers 112 and 212 to have better endurance and retention or better device performance.

In the present embodiment, the mask layers 116, 204, 216, and 304 may be hard masks. The hard masks may include, for example, silicon nitride, titanium nitride, bottom anti-reflective coating (BARC), top anti-reflective coating (TARC) or other materials, but the present invention is not limited thereto.

In an embodiment, the materials of the first conductive layer 102 (or the first conductive stripes 102a), the second conductive layer 202 (or the second conductive stripes 202a), and the third conductive layer 302 (or the third conductive stripes 302a) can include tungsten (W), aluminum (Al), copper (Cu), titanium nitride (TiN), tantalum nitride (TaN), tungsten nitride (WN), doped polysilicon, cobalt silicide (CoSi), tungsten silicide (WSi), titanium silicon nitride (TiSiN), titanium aluminum nitride (TiAlN), tantalum aluminum nitride (TaAlN), TiN/W/TiN or other materials.

In an embodiment, each of the first buffer layers 106 and 206, the second buffer layers 110 and 210, and the third buffer layers 114 and 214 may independently include one of the following materials: doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxide nitride (TiAlON), tungsten oxynitride (WON), tantalum oxynitride (TaON), carbon (C), Si doped carbon. Alternatively, a combination of the above materials can be used.

In one embodiment, the switching layers 108 and 208 may include chalcogenides, such as arsenic selenide ($As_2Se_3$), zinc telluride (ZnTe), and germanium selenide (GeSe). The amorphous chalcogenide-based material used in the switching layers 108 and 208 forms an Ovonic Threshold Switch (OTS), and can have superior conductivity and current mobility to the material used in the memory layer. The switching layers 108 and 208 may include a combination of chalcogenides, including one or more elements selected from a group comprised of tellurium (Te), selenium (Se), germanium (Ge), silicon (Si), arsenic (As), titanium (Ti), sulfur (S), antimony (Sb), and other elements.

In an embodiment, the material of the memory layers 112 and 212 may include a phase change material. Embodiments of the materials of the memory layers 112 and 212 may include chalcogenide-based materials and other materials. Chalcogenide alloys include compounds of chalcogenides and other materials such as transition metals. Chalcogenide alloys usually contain one or more atoms from group IVA of the periodic table, such as germanium (Ge) and tin (Sn). Generally, the chalcogenide alloy includes one or more compound of antimony (Sb), gallium (Ga), indium (In), and silver (Ag). Many phase change memory materials have been described in the technical literature, including alloys: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te, and Te/Ge/Sb/S. In the Ge/Sb/Te alloy family, a wide range of alloy compositions are useful. The composition may be $Ge_2Sb_2Te_5$, $GeSb_2Te_4$, and $GeSb_4Te_7$, for example. In more detail, transition metals such as chromium (Cr), iron (Fe), nickel (Ni), niobium (Nb), palladium (Pd), platinum (Pt) and their mixtures or alloys can be synthesized with Ge/Sb/Te or Ga/Sb/Te to form a phase change alloy with programmable resistance characteristics.

Figure 19:
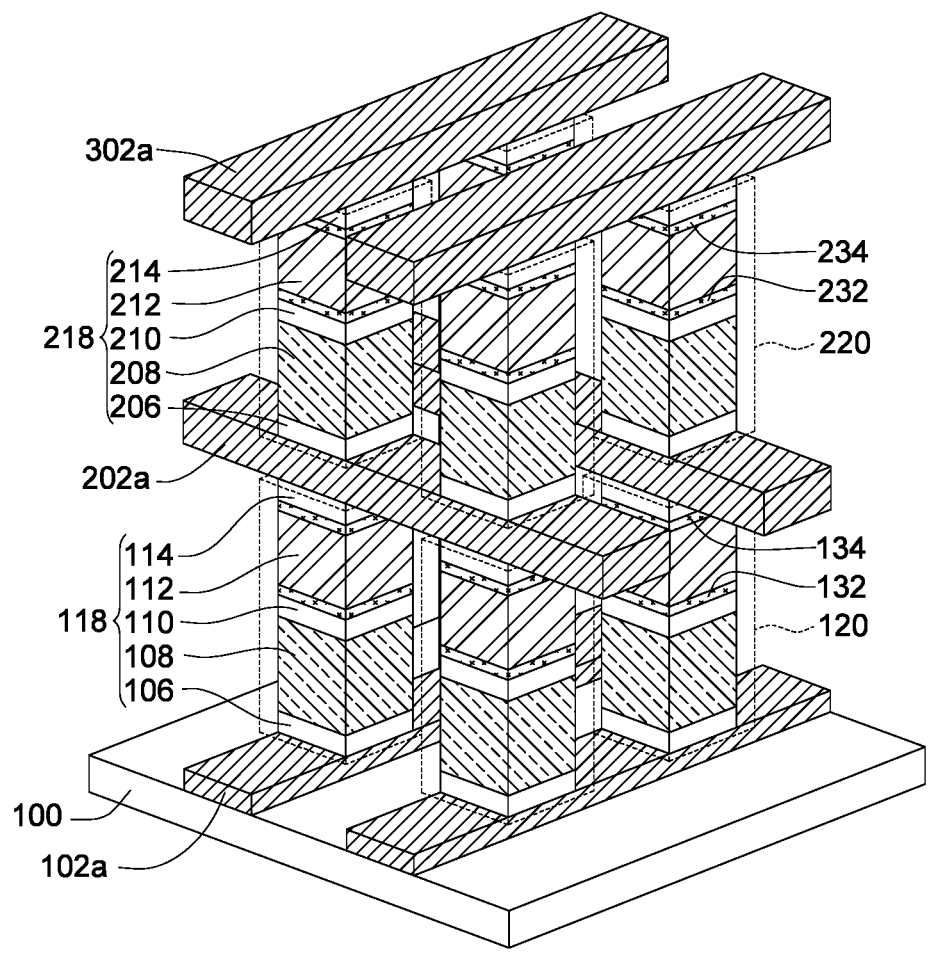
FIG. 19 shows a partial perspective view of a memory device according to another embodiment of the invention.

FIG. 19 is a partial perspective view of a memory device 20 according to another embodiment of the present invention. The difference between the memory device 20 and the memory device 10 lies in the arrangement of the barrier layer, and other identical elements will not be described repeatedly.

Referring to FIG. 19, each of the first pillar elements 118 further includes a first barrier layer 132 and a second barrier layer 134. The first barrier layer 132 is disposed between the second buffer layer 110 and the memory layer 112. The second barrier layer 134 is disposed between the memory layer 112 and the third buffer layer 114. Each of the second pillar elements 218 further includes a first barrier layer 232 and a second barrier layer 234. The first barrier layer 232 is disposed between the second buffer layer 210 and the memory layer 212, and the second barrier layer 234 is disposed between the memory layer 212 and the third buffer layer 214. According to an embodiment, materials of the first barrier layer 132, the second barrier layer 134, the first barrier layer 232 and the second barrier layer 234 may include tungsten (W), respectively.

Compared with an embodiment without a barrier layer, the memory device 20 of the presents embodiment is provided with a barrier layer (for example, the first barrier layers 132 and 232 and the second barrier layers 134 and 234), so that the resistance at the interface between the memory layers (such as the memory layers 112 and 212) and the buffer layers (such as the second buffer layers 110 and 210 and the third buffer layers 114 and 214) may be reduced; the barrier layer can protect the buffer layer, so that the buffer layer is not easy to be damaged during the process of reset when the melting point is high.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
    a substrate;
    a first conductive stripe disposed on the substrate and extending along a first direction;
    a second conductive stripe disposed on the first conductive stripe and extending along a second direction, wherein the first direction and the second direction are parallel to an upper surface of the substrate, and the second direction is intersected with the first direction, a thickness of the second conductive stripe is greater than a thickness of the first conductive stripe, and the second conductive stripe is an integral structure;
    a first pillar element disposed at an intersection between the first conductive stripe and the second conductive stripe, and extending from a top surface of the first conductive stripe to a bottom surface of the second conductive stripe along a third direction, wherein the third direction is intersected with the first direction and the second direction, wherein the first pillar element comprises a switching layer and a memory layer corresponding to a first level; and
    a spacer surrounding and directly contacting the first pillar element,
    wherein the second conductive stripe has a same width in the first direction, and the spacer further surrounds the second conductive stripe to have a same width in the first direction.

2. The memory device according to claim 1, wherein a material of the spacer is silicon nitride.

3. The memory device according to claim 1, wherein the spacer directly contacts the switching layer and the memory layer.

4. The memory device according to claim 1, wherein the spacer has a single-layer structure.

5. The memory device according to claim 1, wherein a material of the spacer includes nitride.

6. The memory device according to claim 1, wherein a thickness of the spacer is between 2 nanometers and 5 nanometers.

7. The memory device according to claim 1, wherein the first pillar element further comprises a first buffer layer, a second buffer layer, and a third buffer layer, the first buffer layer is disposed between the first conductive stripe and the switching layer, the second buffer layer is disposed between the switching layer and the memory layer, and the third buffer layer is disposed between the memory layer and the second conductive stripe.

8. The memory device according to claim 7, wherein the first pillar element further comprises a first barrier layer and a second barrier layer, and the first barrier layer is disposed between the second buffer layer and the memory layer, the second barrier layer is disposed between the memory layer and the third buffer layer.

9. The memory device according to claim 1, further comprising:
    a third conductive stripe disposed on the second conductive stripe and extending along the first direction; and
    a second pillar element disposed at an intersection between the second conductive stripe and the third conductive stripe, and extending from a top surface of the second conductive stripe to a bottom surface of the third conductive stripe along the third direction, wherein the second pillar element comprises a switching layer and a memory layer corresponding to a second level, and the second level is disposed above the first level.

10. The memory device according to claim 9, wherein the second pillar element further comprises a first buffer layer, a second buffer layer and a third buffer layer in the second level, the first buffer layers in the second level is disposed between the second conductive stripe and the switching layer in the second level, and the second buffer layer in the second level is disposed between the switching layer in the second level and the memory layer in the second level, and the third buffer layer in the second level is disposed between the memory layer in the second level and the third conductive stripe.

* * * * *